(12) United States Patent
Schramm

(10) Patent No.: US 7,067,763 B2
(45) Date of Patent: Jun. 27, 2006

(54) HIGH SPEED, LASER-BASED MARKING METHOD AND SYSTEM FOR PRODUCING MACHINE READABLE MARKS ON WORKPIECES AND SEMICONDUCTOR DEVICES WITH REDUCED SUBSURFACE DAMAGE PRODUCED THEREBY

(75) Inventor: Rainer Schramm, Everett, MA (US)

(73) Assignee: GSI Group Corporation, Billerica, MA (US)

( * ) Notice: Subject to any disclaimer, the term of this patent is extended or adjusted under 35 U.S.C. 154(b) by 21 days.

(21) Appl. No.: 10/438,501

(22) Filed: May 15, 2003

(65) Prior Publication Data

US 2004/0060910 A1   Apr. 1, 2004

Related U.S. Application Data

(60) Provisional application No. 60/381,602, filed on May 17, 2002.

(51) Int. Cl.
*B23K 26/00* (2006.01)

(52) U.S. Cl. .......................... 219/121.69; 219/121.68; 219/121.85

(58) Field of Classification Search ............ 219/121.6, 219/121.67, 121.68, 121.69, 121.85, 121.11, 219/121.66
See application file for complete search history.

(56) References Cited

U.S. PATENT DOCUMENTS

| | | | |
|---|---|---|---|
| 4,156,124 A | 5/1979 | Macken et al. | |
| 4,220,842 A | 9/1980 | Sturmer et al. | |
| 4,323,755 A | 4/1982 | Nierenberg | |
| 4,504,144 A | 3/1985 | Trost | |
| 4,522,656 A | 6/1985 | Kuhn-Kuhnenfeld et al. | |
| 4,710,908 A | 12/1987 | Ohshima et al. | |
| 4,734,558 A | 3/1988 | Nakano et al. | |
| 4,758,848 A | 7/1988 | Nakano | |
| 4,820,055 A | 4/1989 | Muller | |
| 4,856,053 A | 8/1989 | Hashimoto | |
| 4,918,284 A | 4/1990 | Weisz | |
| 4,922,077 A | 5/1990 | Gordon | |
| 4,945,204 A | 7/1990 | Nakamura et al. | |
| 4,952,858 A | 8/1990 | Galburt | |
| 4,985,780 A | 1/1991 | Garnier et al. | |
| 5,329,090 A * | 7/1994 | Woelki et al. | 219/121.68 |
| 5,357,077 A | 10/1994 | Tsuruta | |

(Continued)

FOREIGN PATENT DOCUMENTS

JP   11135390 A   5/1999

(Continued)

OTHER PUBLICATIONS

Montagu, Galvanometric and Resonant Low Inertia Scanners, Laser Beam Scanning, Marcel-Dekker, 1985, pp. 214-216.

(Continued)

*Primary Examiner*—M. Alexandra Elve
(74) *Attorney, Agent, or Firm*—Brooks Kushman P.C.

(57) ABSTRACT

An improved method of laser marking semiconductor wafers is provided wherein undesirable subsurface damage to a silicon semiconductor wafer is avoided while providing a relative improvement in marking speed for a predetermined spot diameter. A laser pulse of a laser beam has a predetermined wavelength, pulse width, repetition rate, and energy. The method further includes irradiating a semiconductor wafer with the pulsed laser beam over a spot diameter to produce a machine readable mark on the semiconductor wafer. The mark has a mark depth. The pulse width is less than about 50 ns, and the step of irradiating irradiates over the spot diameter to produce a mark having a mark depth substantially less than about 10 microns.

7 Claims, 16 Drawing Sheets

U.S. PATENT DOCUMENTS

| | | | |
|---|---|---|---|
| 5,386,294 A | 1/1995 | Ototake et al. | |
| 5,406,132 A | 4/1995 | Housako | |
| 5,502,311 A | 3/1996 | Imai et al. | |
| 5,521,628 A | 5/1996 | Montgomery | |
| 5,585,019 A | 12/1996 | Gu et al. | |
| 5,600,478 A | 2/1997 | Stevens | |
| 5,635,976 A | 6/1997 | Thuren et al. | |
| 5,690,846 A | 11/1997 | Okada et al. | |
| 5,719,372 A | 2/1998 | Togari et al. | |
| 5,737,122 A | 4/1998 | Wilt et al. | |
| 5,812,569 A | 9/1998 | Walker et al. | |
| 5,894,530 A | 4/1999 | Wilt | |
| 5,929,997 A | 7/1999 | Lin | |
| 5,932,119 A | 8/1999 | Kaplan et al. | |
| 5,942,137 A * | 8/1999 | Kamir et al. | 219/121.68 |
| 5,965,042 A | 10/1999 | Saitoh | |
| 5,986,753 A | 11/1999 | Seelig et al. | |
| 5,998,759 A | 12/1999 | Smart | |
| 5,999,252 A | 12/1999 | Greisz | |
| 6,144,118 A | 11/2000 | Cahill et al. | |
| 6,177,648 B1 | 1/2001 | Lawson et al. | |
| 6,248,973 B1 * | 6/2001 | Matsumura et al. | 219/121.69 |
| 6,261,919 B1 * | 7/2001 | Omizo | 438/401 |
| 6,262,388 B1 | 7/2001 | Canella et al. | |
| 6,309,943 B1 | 10/2001 | Glenn et al. | |
| 6,339,604 B1 | 1/2002 | Smart | |
| 6,396,640 B1 | 5/2002 | Otomo | |
| 6,483,071 B1 | 11/2002 | Hunter et al. | |
| 6,496,270 B1 | 12/2002 | Kelly et al. | |
| 6,501,061 B1 | 12/2002 | Kital et al. | |
| 6,678,061 B1 | 1/2004 | Kilthau et al. | |
| 6,710,284 B1 | 3/2004 | Farnworth et al. | |
| 2003/0024913 A1 | 2/2003 | Downes et al. | |
| 2003/0102292 A1 | 6/2003 | Han et al. | |
| 2003/0192866 A1 | 10/2003 | Han | |
| 2004/0101000 A1 | 5/2004 | Han et al. | |
| 2004/0118821 A1 | 6/2004 | Han et al. | |
| 2004/0121493 A1 | 6/2004 | Han et al. | |

FOREIGN PATENT DOCUMENTS

| | | |
|---|---|---|
| WO | WO 96/16767 | 6/1996 |
| WO | WO 98/53949 | 12/1998 |
| WO | WO 00/64622 | 11/2000 |
| WO | WO 01/54854 | 8/2001 |
| WO | WO 01/61275 | 8/2001 |
| WO | WO 03/092069 A1 | 11/2003 |

OTHER PUBLICATIONS

Hayes, Orlan, Marking Application Now Encompass Many Materials, Laser Focus World, Feb. 1997, pp. 153-160.

Rossi, Brian, Commercial Fiber Lasers Take ON Industrial Markers, Laser Focus World, May 1997, pp. 143-150.

Keirstead, Mark and Somerville, Paul, UV Lasers Are Workhorses, Optoelectronics World magazine, Jun. 2001, pp. 197-198, 200-201, www.optoelectronics-world.com.

Zayhowski, John, Q-Switched Microchip Lasers Find Real-World Application, Laser Focus World magazine, Aug. 1999, pp. 129-132, 134, 136, www.optoelectronics-world.com.

Scanning Lens Theory, Special Optics, Wharton, New Jersey, May 1997, pp. 36-37.

Special Optics Manufacture and Design catalog, Scanning Lenses, www.specialoptics.com/scanlens.html.

Rodenstock Laser Optics—F-Theta Flat Field Laser Scan Lenses, Laser Optics, www.redenstockoptics.de/pg5.html.

Nikoonahad, Mehrdad, et al., In Situ Height Correction For Laser Scanning of Semiconductor Wafers, Optical Engineering, Oct. 1995, vol. 34, No. 10, pp. 3036-3039.

Kuttner, Paul, Optics For Data Storage, Optische Werke G. Rodenstock, Munich, Germany, pp. 303-305, 331-332 & 383-390.

Invention Disclosure entitled "Calibration System For Fine Die Alignment", shipping date Sep. 1998 to Hewlett Packard.

PCT International Preliminary Examination Report, dated Mar. 15, 2004, pp. 1-4.

PCT International Preliminary Examination Report, dated Aug. 28, 2003, pp. 1-4.

* cited by examiner

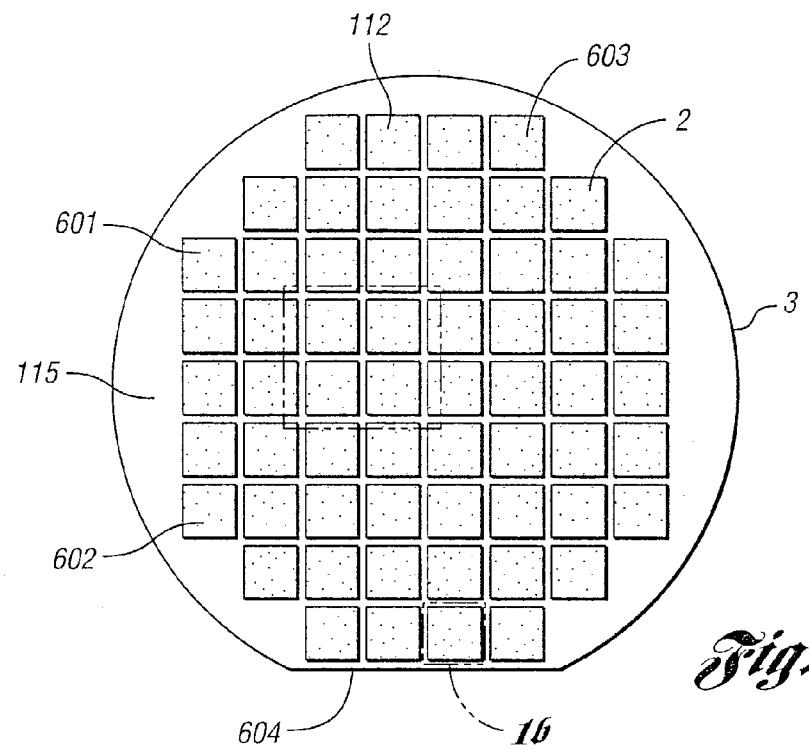
Fig. 1a
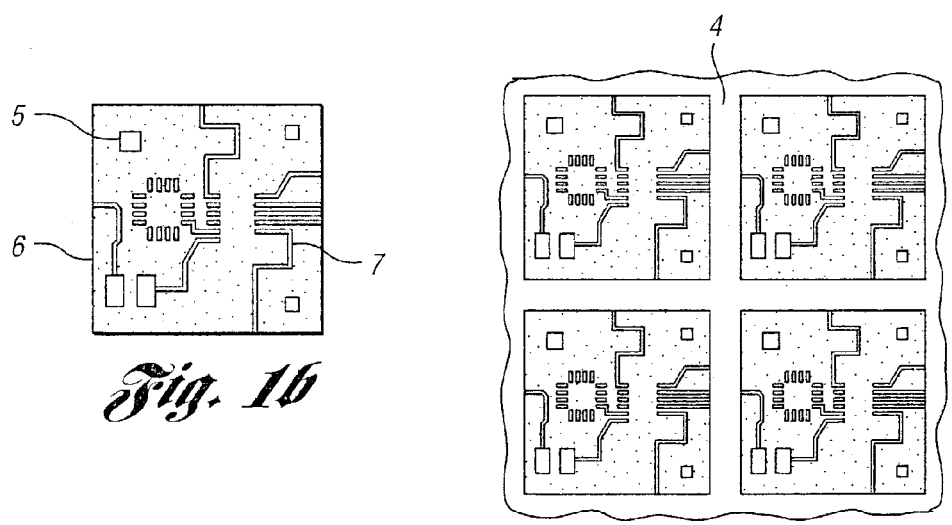
Fig. 1b
Fig. 1c
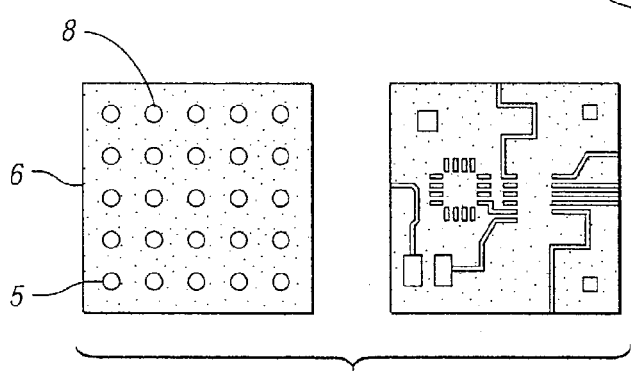
Fig. 1d

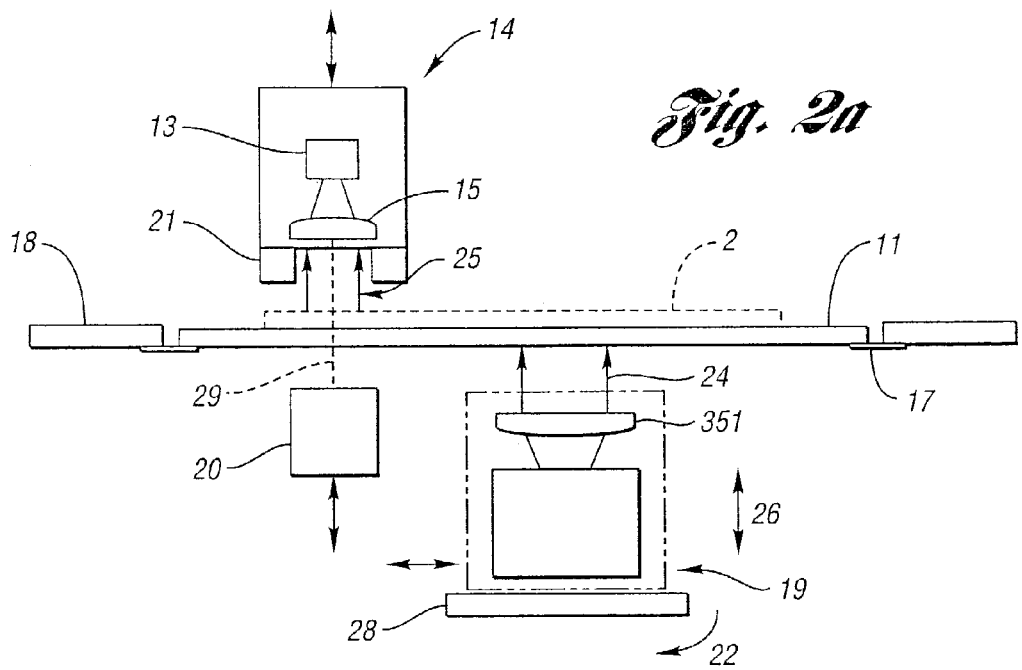
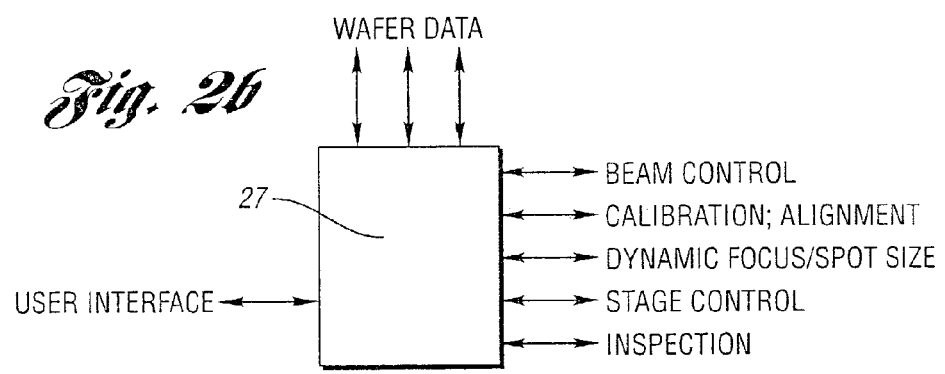
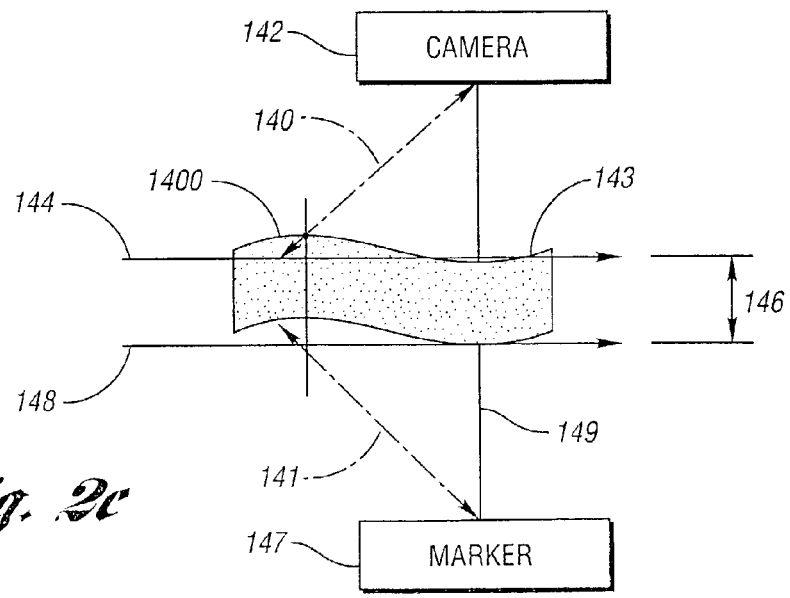

First Wafer

```
Open FOUP
Map Wafers
Wafer move to Pre Aligner
Pre Align
Rotate to OCR position
Wafer ID Read, Decode
Build Mark File
Wafer Move to XY Stage
Wafer held by Chuck
Close Laser Door
Fine Adjustment
              (3) XY Move
              (3) Frame Grab
              Image Process
(16) Marking
              XY Focus
              Focus
              Mark
Wafer Release by Chuck
Wafer Move to FOUP
```

Second Wafer

```
Wafer move to Pre Aligner
Pre Align
Rotate to OCR position
Wafer ID Read, Decode
Build Mark File
```

WAIT

```
Wafer Move to XY Stage
Wafer held by Chuck
Close Laser Door
Fine Adjustment
              (3) XY Move
              (3) Frame Grab
              Image Process
(16) Marking
              XY Focus
              Focus
              Mark
Wafer Release by Chuck
Wafer Move to FOUP
```

....Next Wafer....

```
Wafer move to Pre Aligner
Pre Align
Rotate to OCR position
Wafer ID Read, Decode
Build Mark File
```

WAIT

```
Wafer Move to XY Stage
Wafer held by Chuck
Close Laser Door
Fine Adjustment
              (3) XY Move
              (3) Frame Grab
              Image Process
(16) Marking
              XY Focus
              Focus
              Mark
Wafer Release by Chuck
Wafer Move to FOUP
```

TIME ↓

Fig. 5b

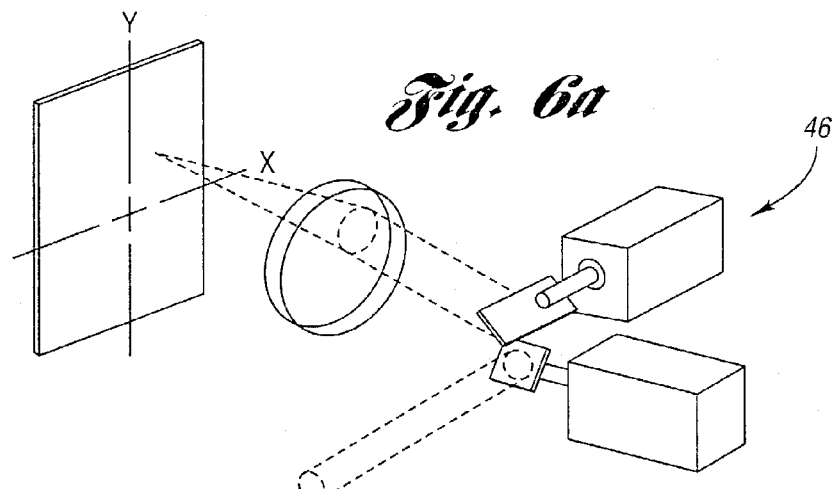
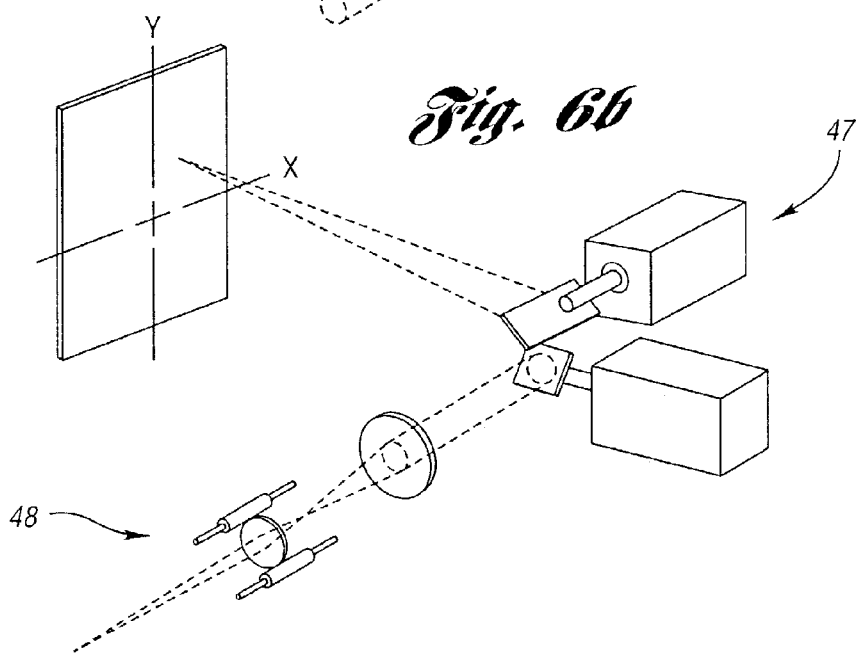
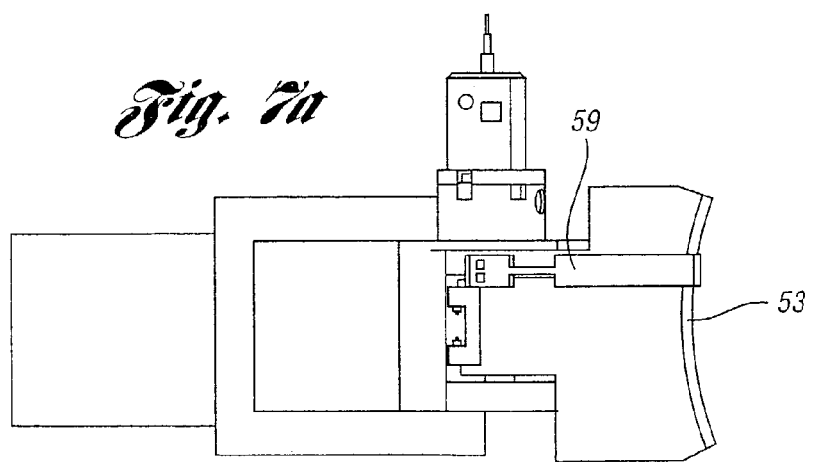

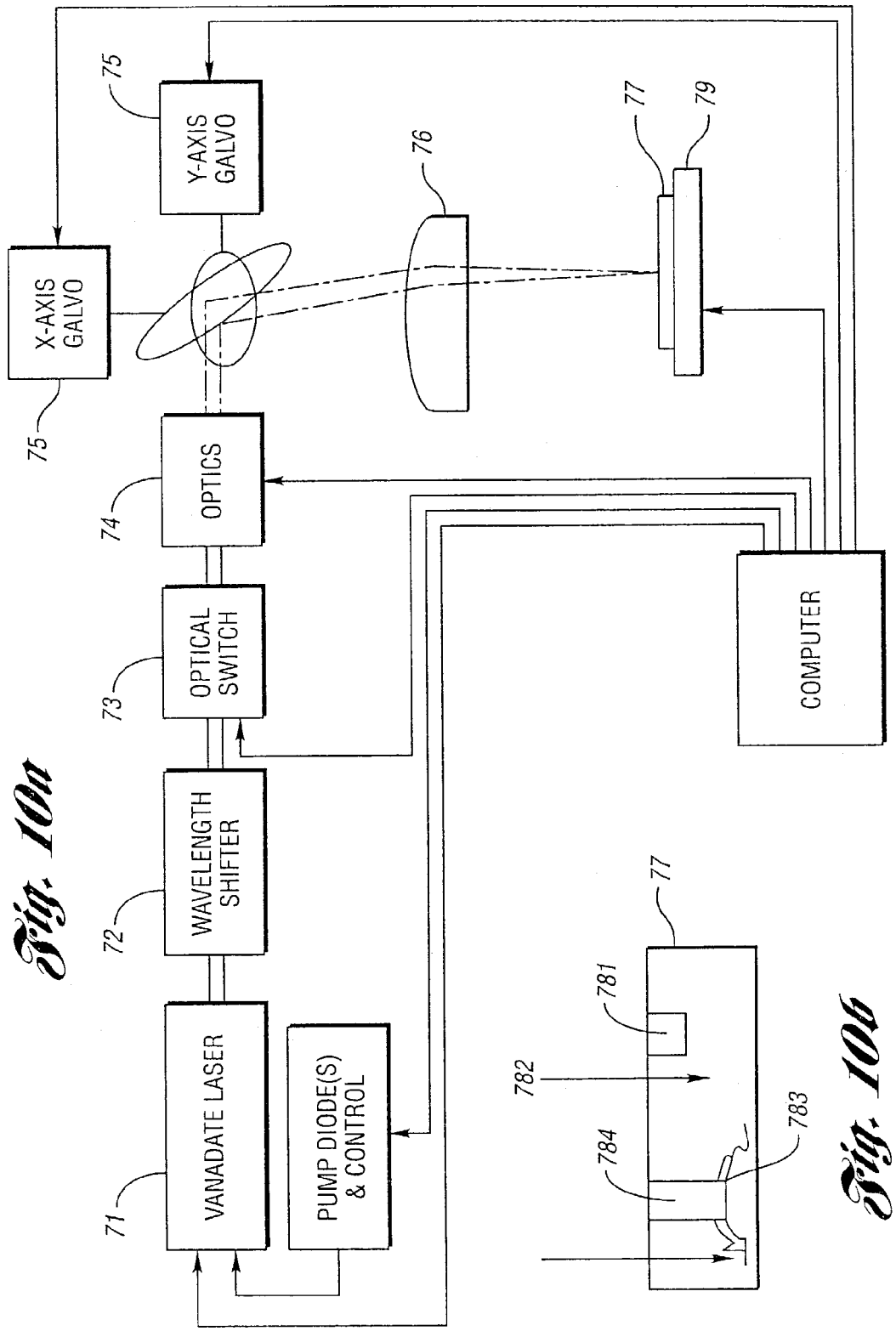

HIGH SPEED, LASER-BASED MARKING METHOD AND SYSTEM FOR PRODUCING MACHINE READABLE MARKS ON WORKPIECES AND SEMICONDUCTOR DEVICES WITH REDUCED SUBSURFACE DAMAGE PRODUCED THEREBY

CROSS-REFERENCE TO RELATED APPLICATION

This application claims the benefit of U.S. provisional application Ser. No. 60/381,602, filed May 17, 2002.

BACKGROUND OF THE INVENTION

1. Field of the Invention

The invention relates to laser marking of semiconductor substrates, for instance silicon substrates having a plurality of die which are to be marked on a front or backside.

2. Background Art

The following representative patent references relate to various aspects of laser marking of wafers and electronic assemblies, illumination, and inspection/reading marks: U.S. Pat. Nos. 4,522,656; 4,945,204; 5,329,090; 6,309,943; 6,262,388; 5,929,997; 5,690,846; 5,894,530; 5,737,122; and Japanese Patent Abstract 11135390.

The following representative references provide general information on various laser marking methods and system configurations and components: "Galvanometric and Resonant Low Inertia Scanners", Montagu, in Laser Beam Scanning, Marcel-Dekker, 1985, pp. 214–216; "Marking Applications now Encompass Many Materials", Hayes, in Laser Focus World, February 1997, pp. 153–160; "Commercial Fiber Lasers Take on Industrial Markets", Laser Focus World, May 1997, pp. 143–150. Patent Publications: WO 96/16767, WO 98/53949, U.S. Pat. Nos. 5,965,042; 5,942,137; 5,932,119; 5,719,372; 5,635,976; 5,600,478; 5,521,628; 5,357,077; 4,985,780; 4,945,204; 4,922,077; 4,758,848; 4,734,558; 4,856,053; 4,323,755; 4,220,842; 4,156,124.

Published Patent Applications WO 0154854, publication date Aug. 2, 2001, entitled "Laser Scanning Method and System for Marking Articles such as Printed Circuit Boards, Integrated Circuits, and the Like" and WO 0161275, published on 23 August 2001, entitled "Method and System for Automatically Generating Reference Height Data for use in a Three-Dimensional Inspection System" are both assigned to the assignee of the present invention. Both applications are hereby incorporated by reference in their entirety.

The visibility of laser marks as seen by a vision system (or by operator visual inspection) may depend on several factors including mark depth, debris, etc. which in turn depend on laser material-interaction. For certain wafer marking applications the conventional wisdom leads to relatively large marking depths which may provide for good readability, but increasing susceptibility to subsurface damage.

Wafer marking systems have long been provided by the assignee of the present invention. WaferMark™ system, produced by the assignee of the present invention for several years, is believed to be the first industrial laser marking system on silicon wafer. Specifications include a 120 μm marking dot diameter hard marking for 300 mm wafers. This meets the SEMI standard specification M1.15. A "soft marking specification" exists for wafer back side soft marking, including marking rough surface back side wafers up to 200 mm wafer. On the "Sigma Clean" system, a backside-marking option is provided for both front and backside marking for up to 200 mm wafer.

With decreasing pitch between marks there is a need for a wafer marking system which can produce high contrast, machine readable marks while limiting substrate damage. With decreasing pitch the spot size of the marking systems is to be decreased. Preferably, the marking speed will be improved notwithstanding the finer pitch.

SUMMARY OF THE INVENTION

An object of the present invention is to provide an improved high speed, laser-based marking method and system for producing machine readable marks on workpieces and semiconductor devices with reduced subsurface damage produced thereby.

In carrying out the above object and other objects of the present invention, a method of laser marking semiconductor wafers includes generating a pulsed laser beam. The beam has a laser pulse with a wavelength, pulse width, repetition rate, and energy. The method further includes irradiating a semiconductor wafer with the pulsed laser beam over a spot diameter to produce a machine readable mark on the semiconductor wafer. The mark has a mark depth. The pulse width is less than about 50 ns, and the step of irradiating irradiates over the spot diameter to produce a mark having a mark depth substantially less than about 10 microns. Undesirable subsurface damage to a semiconductor wafer is avoided.

The mark depth may be in the range of about 3–4.5 microns.

Pulse energy incident on the surface may be in a range of about 230–250 microjoules, the pulse width may be in a range of about 10–15 nanoseconds, and the repetition rate may be in a range of about 15–30 KHz.

The step of irradiating is carried out at a plurality of locations, and the spot diameter may be in a range of about 25–40 microns and the marking speed may be at least 150 mm/sec.

The step of irradiating is carried out at a plurality of locations, and the spot diameter may be in a range of about 30–35 microns and the marking speed may be at least 150 mm/sec.

The spot diameter may be in a range of about 25–40 microns and a marking field size may be in a range of about 75–100 mm.

The semiconductor wafer may comprise a silicon wafer, and the step of generating may be carried out using a frequency doubled Nd:YVO$_4$ laser having a green output wavelength.

The laser repetition rate may be at least 10 KHz, or may be at least 15 KHz.

The undesirable subsurface damage may include microcracking.

Further in carrying out the above object and other objects of the present invention, a pulsed laser system including a laser for carrying out the method of the present invention is provided.

The laser may be a Nd:YVO$_4$ frequency doubled laser having a green output wavelength.

Still further in carrying out the above object and other objects of the present invention, a semiconductor device having a machine readable mark with a depth of about 3–4.5 microns is provided.

The semiconductor device may have a machine readable mark with a depth of about 3–4.5 microns produced by the method of the present invention.

The above object and other objects, features, and advantages of the present invention are readily apparent from the following detailed description of the best mode for carrying out the invention when taken in connection with the accompanying drawings.

BRIEF DESCRIPTION OF THE DRAWINGS

FIG. 1A illustrates a view of the first side of semiconductor wafer having articles, and a field of view covering several articles; laser marking of each article is to occur in a corresponding field on the backside of the wafer;

FIG. 1B shows an article of FIG. 1A in an expanded view;

FIG. 1C is a broken away expanded view of four articles within the field shown in FIG. 1A;

FIG. 1D illustrates exemplary two examples of circuitry which may be present on various articles, for instance a ball grid array and circuit trace patterns;

FIGS. 2A–2B shows several components of a marking system of the present invention with FIG. 2A showing the workpiece and exemplary optical and mechanical components, and FIG. 2B depicting a system controller;

FIG. 2C illustrates, by way of example (not to scale), ray diagrams associated with non-telecentric alignment and marking systems, particularly as applied to backside wafer marking based on topside features;

FIGS. 3A–3C are a number of views wherein FIG. 3A shows a view of the second (bottom) side of the wafer with a marking field, corresponding to the field of view of FIG. 1A, containing the articles of FIG. 1C; FIG. 3B is an illustration, in a broken away view, of marks formed within a designated region on the second side; and FIG. 3C shows an expanded view of a marked article;

FIG. 5B is a schematic illustrating exemplary time efficient sequencing of operations for a wafer marking process;

FIGS. 6A–6B show two alternative beam positioners, which may be used alone or in combination for laser marking;

FIGS. 7A–7D illustrates top, end, side, and perspective views, respectively, of a workpiece positioning mechanism for use in an embodiment of the present invention;

FIG. 10A is a schematic representation of an exemplary laser and optical system for general wafer marking (e.g., topside marker shown);

FIG. 10B illustrates schematically degradation in mark quality (e.g.: due to cracking) with increasing laser penetration depth when compared to a mark produced using a method and system of the present invention;

FIG. 12D illustrates coordinate systems and exemplary circuit features used for relating coordinates of a wafer to be marked with a stored representation of the wafer;

DETAILED DESCRIPTION OF THE PREFERRED EMBODIMENTS

Overview

Figure 5A:
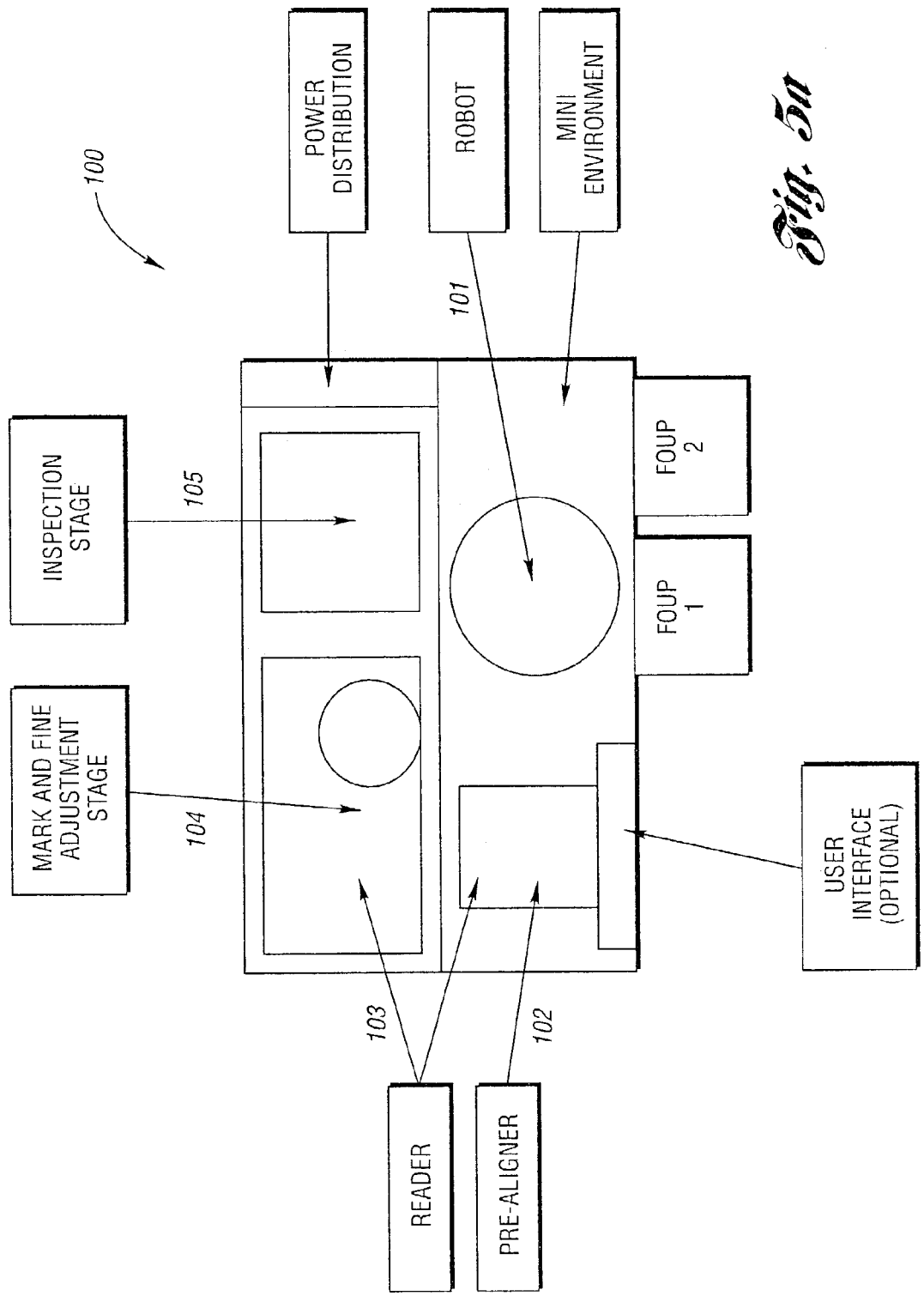
FIG. 5A is a schematic diagram showing certain subsystems of a laser marking system for semiconductor wafers for use in a production system.

Several components of a system 100 for laser marking and inspection of wafers, for instance 300 mm wafers, is schematically illustrated in FIG. 5A. A robot 101 transfers a wafer from a FOUP (Front Opening Unified Portal) delivery device to a pre-aligner 102 which is used to find the notch or flat of the wafer so as to orient the wafer for further processing. Reader 103 may be used to extract certain coded information which in turn may be used in subsequent processing steps. A precision stage 104 is used, and a fine alignment procedure included to correct the residual error of the pre-aligner (e.g., X, Y, rotation). The wafer is marked. All marks, or a designated subset, are then inspected. In the arrangement of FIG. 5A the inspection system is used with a separate inspection stage 105.

A marking sequence, following opening of a FOUP, includes:
1. Robot moves the wafer to the pre-aligner and establishes a notch-die positional relation.
2. The wafer ID is read by an OCR reader.
3. Mark information is obtained from a network.
4. The robot moves the pre-aligned wafer to a precision X-Y stage.
5. Fine X-Y-Theta alignment of the wafer to a least correct residual pre-aligner errors.
6. The wafer is marked using a "mark-index field-mark-index field" repeating sequence.
7. The wafer is inspected.
8. The wafer is returned to the FOUP.

FIG. 5B illustrates an exemplary sequence of operations for time efficient wafer processing in a system. Various processing steps may occur in parallel. For example, a second wafer may be transferred for pre-alignment while fine alignment is occurring on a first wafer.

An exemplary 300 mm wafer may have several thousand articles (e.g.: chip scale packages, integrated circuits). The density of the circuitry on each article can lead to difficulty in placing machine readable marks, such as 1-dimensional or 2-dimensional codes, in restricted areas. For instance, the die size on a 300 mm wafer may vary from about 25 mm to 0.5 mm or smaller, with dense, complex circuit patterns. Further, damage to circuitry which might be caused by a high energy marking beam is to be avoided. WO0154854, assigned to the assignee of the present invention and hereby incorporated by reference in its entirety, discloses a method of high resolution marking of electronic devices. Laser mark registration is obtained from circuit features measured with a sensor, and in one embodiment the sensor is located disjoint from a marking head. Examples are included in '854 for marking of PCB multi-ups and packages such as chip scale packages and die in a tray. Sections of the '854 disclosure, including: page 4, lines 9–16, page 6, lines 1–5 and 22–29, Page 8, lines 10–17, page 9, line 15-page 10, line 30, page 11, lines 14–20 and the sections in the detailed description entitled "scan head", "marking operation", and "registration" and the associated drawings of the sections are related to the present disclosure and provide additional support for various aspects of precision marking methods and systems disclosed herein.

Figure 3A:
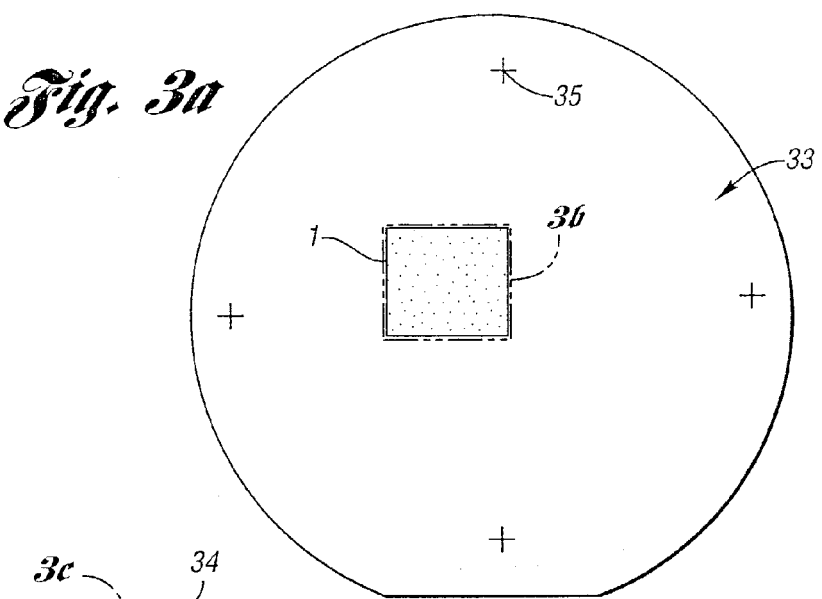
Figure 3B:
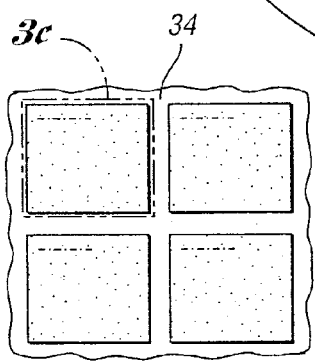
Figure 3C:
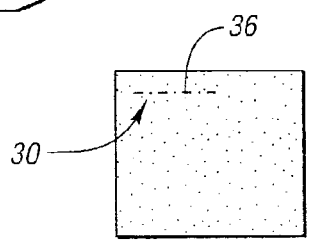

Referring to FIG. 1A, one embodiment of the present invention provides a precision laser based method of marking a semiconductor wafer 3, and the method may be adapted to marking of packages, substrates or similar workpieces. The wafer 3 may have articles 2 (one shown in an expanded view in FIG. 1B) which may include die, chip scale packages, circuit patterns and the like. The articles may be substantially identical, but such a restriction is not necessary. In a typical semiconductor manufacturing operation, subsequent to marking, the articles will be the separated by precisely cutting ("dicing") the wafer. Further information may be found in U.S. Pat. No. 6,309,943 wherein alignment marks 35 (see FIGS. 3A–3C) placed on the back of a wafer are used to define a path for precision cutting. Referring to FIG. 3, the marks 36 on an article are to be formed within a designated region 30 relative to an article position. In this example the backside 33 of the wafer 3 is marked near a corner of the article. Circuits 34 correspond to a backside view of circuits 4.

In a preferred embodiment for marking large (e.g.: 300 mm) wafers a calibration process will be used to relate an alignment vision system coordinate (e.g., a "first side" position, for instance at the sensor center position, and at best focus) and beam positioning sub-system coordinate (e.g.: laser beam waist position at the center of a marking field). Preferably, the calibration will provide three-dimensional correction. The increasing demand for precision placement of marks in localized areas over a large field lead to increasing beam positioning accuracy and decreasing spot size requirements for obtaining finer line widths or character sizes. Over a large workpiece "sag" and warpage may be significant relative to the depth of focus, which introduces conflicting design parameters. Preferably, a laser spot size can be adjusted during system operation while maintaining spot placement accuracy. With reference to the arrangement of FIG. 2A, one embodiment includes calibrating a first sensor sub-system 14 (e.g., a "alignment vision system") and a beam positioner sub-system 19 (e.g., "marking head"). The calibration is used to relate a first side position and a marking beam position, the sub-systems each having a field of view which is a portion of a workpiece 11 to be marked. The workpiece may be a semiconductor wafer 3. Further details regarding various steps of a calibration process providing both 2-dimensional and 3-dimensional capability are provided in SECTION 1 which follows entitled "2D/3D Calibration." Further details on various calibration procedures for workpiece processing can be found in exemplary references (1) U.S. Pat. No. 5,400,132 entitled, "Rectification of a Laser Pointing Device, " (2) U.S. Pat. No. 4,918,284 entitled "Calibrating Laser Trimming Apparatus," and (3) WO0064622, "Laser Calibration Apparatus and Method."

FIG. 2C illustrates, by way of example, the multiplication of beam position error with depth in a non-telecentric system when marking a warped wafer 143 on the backside using frontside data (though not so restricted). The wafer has a thickness 146, which is typically at least a few hundred microns. Topside alignment camera 142 is shown, for the purpose of illustration, to be aligned with marker head 147 along optical centerline 149. Planes 148, 144 represent reference planes corresponding to working distances from the marker and camera respectively. In absence of depth variations, these planes intersect camera viewing rays and marking beams at wafer surface positions. Reference data along ray 140 is obtained from a reflection at the wafer surface at the point of intersection of the wafer. The data will be, without correction, represented as a coordinate corresponding to the intersection with plane 144, which is to be related to a marking coordinate. A lateral position error 1400 results. Assume for the purpose of illustration a mark is to be placed on the back of the wafer at a position corresponding to reference data taken along ray 140 at the wafer intersection. A marking beam, without correction, will be directed to a point in the plane 148 corresponding to the reference data (and position error). However, this may result in a mark outside of a designated region, as shown by the direction of central ray of marking beam 141 at the actual intersection point with the wafer.

The three-dimensional calibration process of SECTION 1 of the Appendix, with suitable height measurements of the wafer, may be used to determine a correction to be applied to the beam positioner.

In a preferred telecentric system, the error is reduced to about 1 spot or finer with a lens (see SECTION 5 which follows entitled "Precision Telecentric Lens") of low to moderate cost. Preferably, the telecentric design compensates for the worst case wafer warpage and additional system "stackup" errors. With the preferred arrangement a field size supporting relatively high marking speeds is maintained. In the telecentric case the calibration process may be streamlined, but multiple calibration files used to at least control and maintain the laser spot size over the working volume are preferred. This provides for consistent marks and for mark contrast control.

Three-dimensional tolerances are to be considered for the alignment and marking sub-systems in view of the workpiece variations relative to the depth of focus of the optical systems. Increasing the alignment system magnification to improve feature location accuracy decreases the depth of focus. Various focusing methods are useful to position the entire sub-system 14 and/or lens system 15 (shown as a telecentric lens but not so restricted) relative to the workpiece along the Z-axis. For example, the Z-axis position corresponding to the maximum edge contrast at a die location is a possible measure. A measurement of the maximum intensity of a "point" or small target (one the order of a pixel) may provide more sensitivity to depth changes.

Wafer "sag" is somewhat predictable from a specification of wafer thickness. Predictions based on models (fixed edge and simple support) with wafer thickness ranges of about 300 µm to 775 µm indicated about 60 µm of deviation for the latter case. For thinner wafers the deviation increases, and the overall deviations may be further increased by warpage and other stackups. Surface deviations may be estimated and used for certain correction. A telecentric system, for instance as described in SECTION 5, is predicted to yield less than 1 µm of spot placement error over a 4" marking field. Various sub-systems, including the scan head, alignment vision system, and perhaps inspection system may include at least an option for height sensing. Similarly, a separate sub-system could be added specifically for height measurements at a plurality of locations on the wafer surface. Preferably, any degradation in the cycle time of the machine will be negligible.

In one arrangement the alignment vision system 14 will be relatively positioned at sample points which may include but are not limited to the regions used for feature detection. As mentioned earlier, the focus sensing may be achieved by sampling the image contrast at locations along the z-axis using the alignment vision system. The z-axis locations are recorded. Alternatively, a triangulation or focus sensor, which may be a commercially available module, may be used for measuring surface points which are used with the alignment and calibration algorithms (and the known wafer thickness) to map the surface. Similarly, a direct measurement of the second side may be obtained with a sensor included with the vision inspection module 20. In an alternative arrangement a "full field" system, for instance a commercially available Moire Camera, may be used. In any case, the data will preferably be used to position the marking beam waist at the surface. In accordance with the preferred calibration method of SECTION 1, the desired spot size will be maintained at the marking locations. In one arrangement the marking beam waist may be positioned in discrete steps, for instance at 9 locations within an 80 mm field for center-edge compensation. Non-contact optical sensing is preferred, but capacitance or touch probes may be acceptable.

If the deviations correspond to a simple second order curve and are symmetric, then the wafer surface may be sampled along a diagonal direction using at least three locations (edge region, center, edge region). If warpage is represented with a higher order curve (e.g.: "potato chip") additional data will be acquired, for instance at least nine locations. If the data is acquired with the first side alignment system, the second side location may be approximated using the thickness of the wafer, which may be measured or specified by the operator.

Similarly, both for calibration and marking, a marking beam focus function may be sampled at a number of locations in the marking field (at reduced power). The system may include a detection system suitable for measuring "featureless" surfaces, for example a bicell or quad-cell arrangement. Alternatively, a projected grid may be used similar to the options provided in commercially available Metrology equipment manufactured by Optical Gaging Products (Rochester, N.Y.). The focusing tool will preferably be used for both alignment and system setup operations in addition to measuring the working distance during wafer marking.

In the system of FIGS. 2A and 2B, both the beam positioning subsystem and the alignment system preferably include telecentric optical systems 351 and 15, respectively, which reduce or eliminate variation in the position of an angular scanned marking beam position with depth. SECTION 5 shows a telecentric lens system which provides spot placement accuracy better than one spot diameter over a field size of about 80 mm, and over a depth range corresponding to worst case expected sag/warpage. The 80 mm field allows for significantly higher marking speeds compared to smaller non-telecentric fields. Furthermore, the 30 µm spot size is finer than most wafer mark systems, a desirable feature for controlling mark contrast and resolution.

However, other alternatives may be used with appropriate compensation for positioning with depth. For instance, in one embodiment a telecentric lens 15 may be used, but an arrangement similar to 47 of FIG. 6 may be used for marking (as discussed below).

With reference to FIG. 2A, the preferred alignment sub-system will have a high resolution camera 13, for example a 1280×1000 CCD imaging array with image processing hardware and software for extracting and processing smaller regions using a "software zoom" feature. Alternatively, a calibrated "zoom" optical system may be used. Illumination system 21 may include special illumination design, for instance a combination of dark and bright field illuminators, to enhance the contrast of features used for alignment. In one embodiment an LED array provides low angle illumination, with a manually adjustable angle. In the configuration using the high resolution camera the exposure is fixed which simplifies the design, eliminating the dependence of the image "brightness" with magnification.

Figure 4:
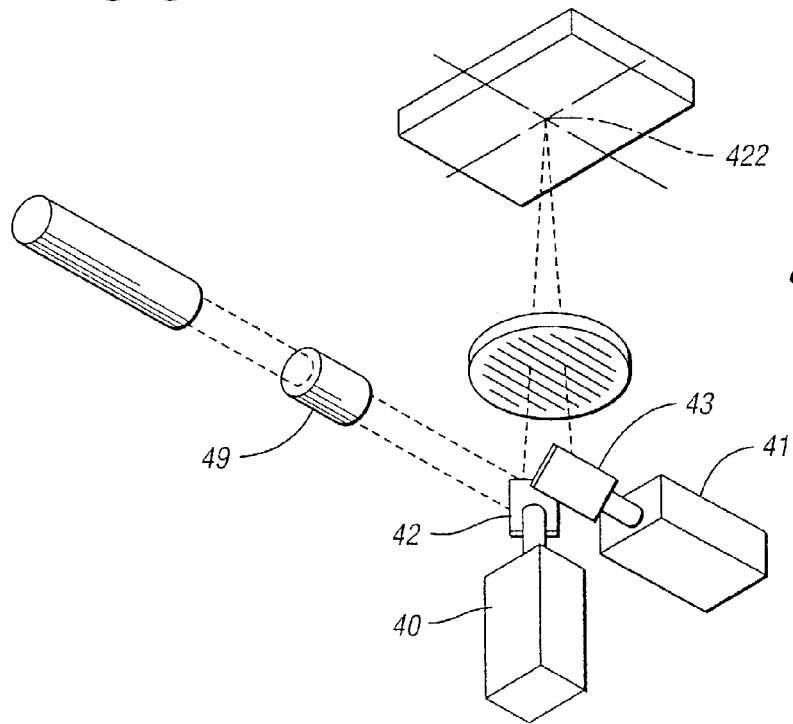
FIG. 4 shows an example of a galvanometer beam positioning system, which may be used in an embodiment of the invention for backside marking.

In one embodiment, the marking sub-system 19 includes the system shown in FIG. 4 with X-Y galvanometers providing deflection system 40, 41, 42, 43 and possibly a beam expander assembly 49. FIG. 6, incorporated from the earlier cited reference to Montagu, pp. 227–228 shows alternative pre-objective 46 (e.g.: telecentric) and a post-objective 47 scanning arrangements, the latter incorporating an additional dynamic focus translator 48. In a preferred telecentric system of the present invention components may be included for dynamic focus 48 and/or spot size adjustment with a computer controlled version of expander 49 of FIG. 4.

The fine alignment system provides correction for residual X-Y-angle errors associated with the transfer and pre-aligner. In one embodiment wherein only small variations occur or are specified, the alignment system may correct X, Y, and theta (e.g.: angle) variations with measurements taken at three locations (e.g. fiducials). However, with emerging tight tolerances an increasing density of circuit/wafer, increased accuracy is preferred. The fine alignment system of 14 provides added capability of recognizing and/or measuring features associated with an article 2 of the wafer (e.g.: machine vision/pattern recognition capabilities). A feature location will be determined. An algorithm is used to obtain reference data and to locate a feature associated with at least one article 2 on a first side of the workpiece 3 using at least one signal from the first sensor 13. For example, article 2 of FIG. 1A, shown in an expanded view of FIG. 1B, may have a circuit pattern with detectable conductor traces 7 or pads 5 which may be replicated 4 in at least a portion of the wafer (but not necessarily over the entire wafer). In a preferred system, a pattern recognition algorithm will, based on "training" on a reference wafer, for instance, automatically learn at least a portion of the workpiece structure and determine the relative location of the pads, traces, or similar features. For instance, the rectangular outline of a die (article) 6 or corner locations may be used as one feature to locate the die edge and/or estimate the center. The location may be related to a location of at least one other die in 4 located within the marking field 1 of FIG. 3A, or possibly outside the field if tolerances permit. For example, a minimum of 3 non-collinear locations are determined over the workpiece and used to calculate an offset and rotation correction for the entire workpiece. Another pattern may be defined by the location of an array of solder balls or pads 8 as an alternative/equivalent. Yet another pattern may include sections of internal circuitry of the article having even greater density than illustrated in FIGS. 1A–1D. The algorithm may include matching features of the workpiece using a machine vision sub-system, for instance a grey scale or binary correlation algorithm. Various "modules" and algorithms for pattern recognition and matching are commercially available (e.g.: Cognex Inc.) which may be adapted for use with the present invention. The workpiece may have identical and repetitive patterns.

In a preferred arrangement the matching is automatically performed over all the articles, and without human intervention. It should be noted that many combinations of patterns may be present on a wafer with special marking requirements (e.g.: "binning") and the preferred algorithm will have substantial flexibility. The "training" may further include a semi-automatic, operator guided teaching phase so as to efficiently program the machine for recognition and matching of complex patterns.

In WO 0161275, incorporated by reference and assigned to the assignee of the present invention, various detection and recognition algorithms are disclosed for automatic learning of circuit features using grey-scale and/or height information, and subsequent use of the stored information for inspection. For instance, the following sections of the '275 disclosure: page 7, lines 4–26; page 8, lines 1–5 and lines 17–25; page 9, lines 5–10; page 10, lines 24–25; page 11, lines 1–18; page 15, lines 29–30; page 16, lines 1–10; page 17, lines 19–28 and the associated drawings teach the application of various pattern recognition and learning algorithms. Further details of various steps for detection and matching features for obtaining reference locations for precision marking of wafers and similar articles are disclosed in SECTION 2 which follows entitled "Feature Detection and Fine Alignment."

In one embodiment of a 300 mm marking system, an 80 mm marking field is used for high speed, and an alignment vision field of approximately 16 mm is used to for feature detection. With a 1024×1024 array a 16 µm pixel size will be provided, which is somewhat finer than the spot size of the marking beam. For example, in an embodiment of a backside wafer marking system a spot size of less than 40 µm is preferred, with a most preferred range of about 25–35 µm. The marking field 1 dimension (depicted in FIG. 3 and corresponding to the region 4 of FIG. 1-A but on the backside 33 of wafer 3) may be a relatively small fraction of the workpiece 3 dimension (e.g.: a 300 mm maximum wafer size in a system configured so as mark wafers of varying specified dimensions). For example, in one embodiment for marking 300 mm wafers nine or more marking fields having dimensions in the range of about 75–100 mm are used to provide marking precision and high speed operation. In a case where a workpiece is severely warped, the marking field may be reduced by controlling the amplitude of the scan angle, based on surface measurements or a specification. Precision marking includes relatively positioning the beam positioner sub-system 19 (or a component of the sub-system) and the workpiece 11 so as to position a laser beam at a marking location 30 on a second side of the workpiece 33 as shown in FIG. 3, the positioning based on the feature location on the first side. The feature location may define the location of the article (e.g.: edge or center) or otherwise be related to designated region(s) 30 for marking located on the second side. Various methods and sub-systems may be used for the positioning as described in more detail below.

As shown in FIGS. 3A–3C, a predetermined code or other machine-readable indicia 36 is marked on the workpiece, typically with a scanned laser marking output beam (vector or dot matrix, for instance) within the field defined by 24 of FIG. 2A, preferably using telecentric lens 351. A machine readable mark is formed in the designated region. Also, laser induced damage to an article 2 is avoided by marking the second side.

The steps of obtaining reference data, relatively positioning, and marking are repeated so as to locate a feature associated with at least one article on the first side, and to position a marking beam within all the designated regions on the second side based on the feature location(s).

The beam positioning sub-system preferably includes a 2D galvanometer scanner 40, 41, 42, 43 as shown in FIG. 4 (but preferably adapted for irradiating the workpiece with a telecentric beam as shown in FIG. 2A and approximately as in arrangement 46 in FIG. 6). Alternatively, the sub-system may include a translation stage or rotary stage with beam delivery optics. The laser and optical system may be integral or remotely coupled, for instance with a fiber delivery system. The field of view of the beam positioner may range from a few laser spot diameters to a relatively wide angular field, but for precision marking in accordance with the present invention the field will be a portion of the largest workpiece to be marked in the system. For example, wafers of 100, 200, and 300 mm may be marked and the marking field 1 dimension (e.g.: first side view in FIG. 1A, second side view in FIG. 3A) may be about 100 mm. In certain cases a pattern may be marked on workpiece (say with a lower laser power requirement) with parallel beams as illustrated in publication WO961676, and/or U.S. Pat. No. 5,521,628. Various combinations of serial and parallel operation may be used, for instance with multiple marking heads as taught in U.S. Pat. No. 6,262,388. The 2D/3D calibration process of the present invention may be adapted to these marking configurations to maintain accuracy.

Relatively positioning may further include: (i) providing a beam positioner which may include a 2D galvanometer deflector; (ii) adjusting a mirror 42, 43 position (See FIG. 4) if the marking location is within the field; (iii) relatively translating the workpiece 11 and beam positioning sub-system 19 so as to position the location within the markinpg field 1 whenever the location is outside the marking field. The features related to article 2 (also depicted by the dashed lines of FIG. 2A) are used as discussed above to determine a position of the marking beam, and the position will preferably be a three dimensional coordinate. Further, the specified or measured thickness of the wafer may be a parameter used to determine the focal position of the beam relative to a front side position.

In a preferred system for wafer marking at least one workpiece positioner is used in addition to stage 18 (also depicted as 104 in FIG. 5A) for fine positioning. The positioning sub-system is configured so as to support and position workpieces 11 of varying specified dimensions, while allowing radiation beams (marking beam(s) over field 24 and illumination/viewing beams in fine alignment camera field 25 from light source 21) shown in FIG. 2A to directly irradiate the first and second sides of the workpiece. In one embodiment, a wafer chuck 17 (see SECTION 3 which follows entitled "Workpiece Chuck/Positioner") is provided with a Z-axis (direction 26) drive with an option of smaller wafer inserts to support the wafer or other workpiece. The system is preferably automated with an arrangement of end effector(s) transferring the workpiece to the chuck 17 which automatically clamps, grips, or otherwise supports (shown in a single schematic view in FIG. 2A) the workpiece. Surface damage and significant distortion are to be avoided.

In view of the aforementioned emerging three-dimensional variations and tolerance requirements, it is preferred that the marking beam focus position shown as 422 in FIG. 4 (e.g.: beam waist) and attitude (roll, pitch relative to the focal plane) depicted by the arrow 22 (see FIG. 2A) be adjustable. For example, variations in "sag" or warpage of the wafer in addition to stackup tolerances may be compensated by providing a total adjustment range of at least about +or −2 millimeters. Referring to FIG. 2A, the adjustment may include relative Z-axis (depth) positioning of the laser beam positioning sub-system 19 and workpiece along a direction substantially perpendicular to the workpiece so that the beam waist of the laser substantially coincides with the workpiece. The adjustment may be dynamic and done for each wafer. The adjustment may include tilting 22 (pitch, roll) of the laser beam positioner and/or workpiece to so that a focal plane of the laser beam is substantially parallel to a local planar region of workpiece (e.g.: over a marking field). Alternatively, a planar region may correspond to a best fit plane over the workpiece. Some adjustments may be done with a combination of manual or semi-automatic positioning of the beam positioner, for instance during calibration or setup. Similarly, the end effector(s) and the chuck 17 coupled to precision stage 18 may be controlled by a program so position the workpiece 11 in angle (roll, pitch) and depth. SECTION 3 of the Appendix illustrates specific details of an embodiment for automatic precision positioning of a circular (for instance a 300 mm wafer) or rectangular workpiece with actuators for adjustment of the height and preferably attitude. The arrangement is particularly adapted for height adjustment. Various modifications, for instance spherical or point contact at the support base 53 in FIGS. 7C and 7D, will facilitate the fine angular positioning (roll, pitch) of the workpiece, for instance, tilting wafers having thickness of 300 μm or less.

In an alternative arrangement the wafer may be held in a vertical position. For instance, a suitably modified and automated version of the "Wafer Edge Fixture" produced by Chapman instruments, and configured for a maximum wafer size 300 mm (Chapman Instruments, Rochester, N.Y., and referenced to U.S. Pat. No. 5,986,753) may be used. Six degrees of freedom are included for profiling of wafers. Further description of the tilt stage, wafer chuck, X-Y-Z stage, and controller are found in the article "Wafer Edge Measurements—New Manual Fixture Provides More Features."

In one embodiment for wafer marking a "split gantry" stage is an alternative with automatic positioning of the horizontal mounted marking head along one direction (e.g.: "X", horizontal, into the page) and wafer positioning in at least a second direction (e.g.: "Y" vertical and along the page, and "Z" along the optical axis, and preferably including capability for roll and pitch adjustment).

Figure 15:
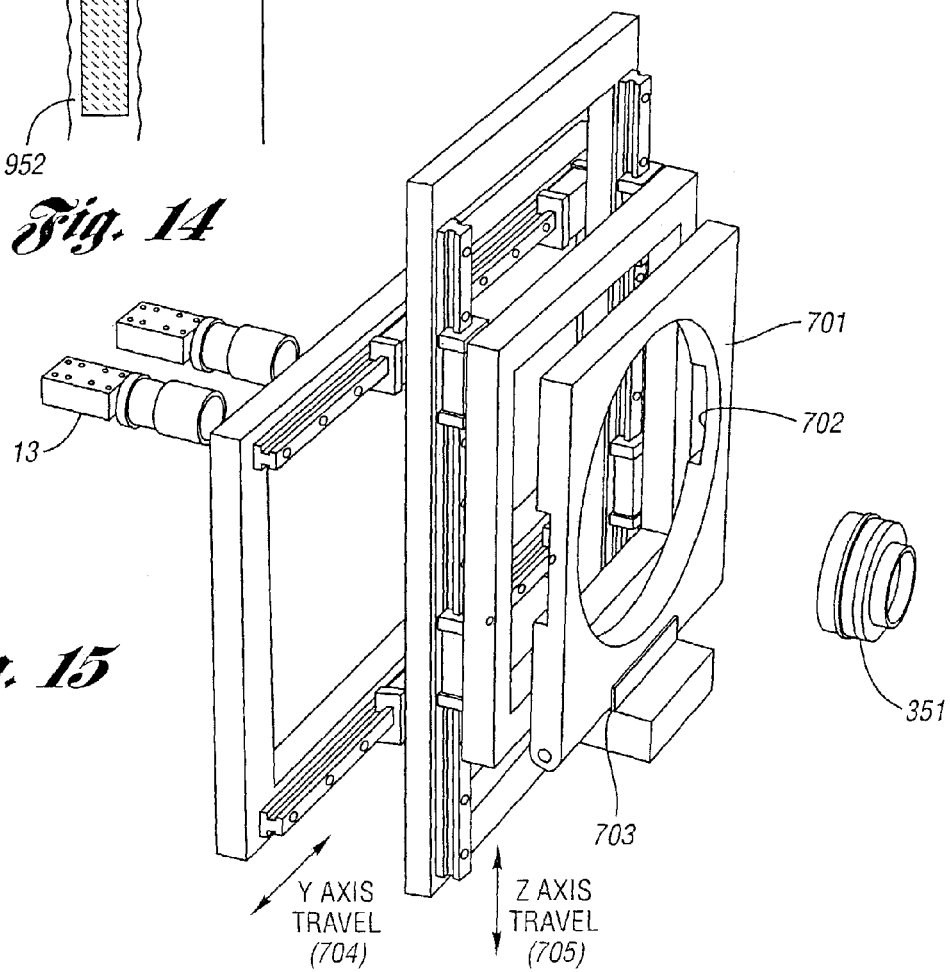
FIG. 15 schematically illustrates a wafer positioning system wherein the wafer is initially loaded in a horizontal position, and moved to a vertical position for alignment, marking, and inspection operations.

FIG. 15 illustrates a perspective view of yet another positioning arrangement with several components marking system also illustrated. The wafer is translated in two dimensions (e.g.: translation in a plane perpendicular to the page of FIG. 2A). The wafer is oriented with an end effector to notch 702 and loaded into holder 701. A hinge 703 is used for loading in the horizontal position followed by transferring to a vertical position for marking with a beam incident through scan lens 351. At least two axes of motion 704 and 705 are provided. The construction allows for marking the backside and for fine alignment using camera 13 wherein the location of front side features are used to position the marking beam.

Figure 16:
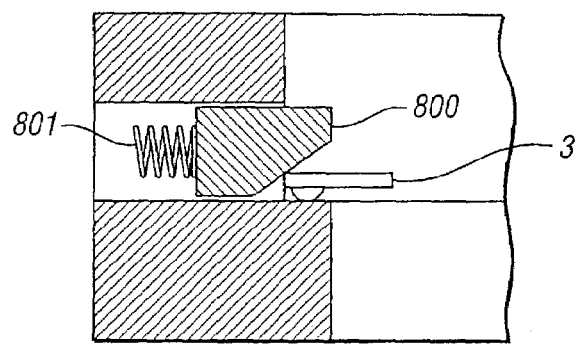
FIG. 16 shows a wafer holder capable of supporting wafers in horizontal, vertical, and upside down configurations.

FIG. 16 shows details of one arrangement for holding wafers at various orientations. In this arrangement wedge 800 is engaged by a spring 801 held open by vacuum so as to allow for mounting in a horizontal, vertical, or upside down orientation.

Various combinations of the motion (manual or automatic) of the (1) workpiece positioner 18 and (2) beam positioning sub-system (e.g.: "marking head") 19 and/or (3) internal components of 19 (e.g.: a dynamic focus sub-system 48 and/or beam expander 49 may be used and coordinated with controller 27. For instance, five axes of motion (e.g.: X, Y, Z and Roll, Pitch) may be implemented for precision positioning in a wafer processing station 100. Further, coarse (possibly manual or semi-automatic) positioning may be implemented in one or more axes, for instance.

The selection of laser pulse characteristics can have a significant effect on the speed, contrast, and overall quality of the marks. For backside marking of Silicon wafers a pulsewidth of about 15 ns, repetition rate of about 25 KHz, and output energy of about 0.23–0.25 millijoules at a wavelength of 532 nm provided favorable results. A short cavity green Vanadate laser was used. Further, marking depth penetration of about 3 μm–4.5 μm provided machine readable marks without internal damage (e.g.: cracking) of the wafer. Marking speeds of about 150 nm/sec were achieved, and it is expected that about 350 mm will be achievable with preferred laser parameters. The marking speed represents a relative improvement for marking in view of the large number of articles to be marked at high resolution, An exemplary range of operation includes pulse width of about 10–15 ns, repetition rate of about 15–30 KHz, with focused spot size of about 30–35 μm for marks on Silicon wafers. Another range may include a pulsewidth of up to about 50 ns, and a minimum repetition rate of about 10 KHz. Microcracking is also prevented by limiting penetration of the beam to a depth of less than about 10 μm. It is expected that a wavelength of 1.064 μm will be suitable for marking metal workpieces, with frequency doubled operation for Silicon wafer marking. Further details on a preferred laser and associated characteristics are disclosed in SECTION 4 which follows entitled "Laser Parameters and Mark Quality."

Referring to FIG. 2A, a vision inspection system 20, viewing the second side, will generally include an illuminator, camera or other imaging device, and inspection software. In a preferred system the inspection field is calibrated to the fine alignment vision field. For instance, the centerlines may be aligned 29 as shown in FIG. 2A, with a large overlap between the fields. This provides for overlaying the marks on the die for mark manual or automatic visual verification. SECTION 6 which follows and is entitled "Backside Mark Inspection With Frontside Die Registration" describes details of an embodiment for inspecting marked wafers. All the marks (100% inspection) may be inspected, or a user-specified subset. For example, a few locations on the wafer may be marked and the results analyzed. If the results meet specifications all the remaining designated regions of the wafer may be marked. The vision system may be mounted on a separate stage wherein a first wafer is inspected while a second is marked (See FIG. 5A). FIG. 2A illustrates an alternative arrangement wherein a single stage 18 is used to position the workpiece for both inspection and marking.

The inspection system will preferably provide feedback regarding mark quality as rapidly as possible to maximize yield. For instance, a wafer may have 30,000 chip scale packages as articles. A marking field may have at least a thousand die. A separate inspection system with "standard" lighting for viewing marks may be an advantage to establish correlation between various stages of the wafer and device assembly steps wherein the marks may also be viewed. In an embodiment where the inspection system optical axis is separated the inspection may occur in a sequence where a first field is marked and then inspected. The inspection of the first field will occur while a second adjacent field is being marked when a large number of articles are to be inspected.

In an embodiment using a pair of galvanometer mirrors, data representing at least a sample of die (or other article) over the field may be acquired with a "through the lens" vision system (e.g.: a second simpler vision system for the case of wafer mark inspection). The data processing operation may overlap with positioning (indexing) to an adjacent field. It should be noted that the coaxial vision system might not require a vision system with complete inspection capability. For instance, the intensity or radiation pattern of the reflected scanned beam may be analyzed for early detection of gross mark defects or other process problems. For instance, a single photodetector may be used to analyze the reflected marking beam. Telecentric viewing (e.g.: received through lens 351) reduces variations with angle, which can provide for improved classification of signals.

Some further discussion of various alternatives:

In a preferred embodiment the workpiece 11 is translated when indexing to marking fields. However, the relative motion of the workpiece 11 and beam positioning sub-system 19 may include translation of at least a portion of the beam positioner (or a component). When marking wafers, a single X-Y stage moving the wafer allows for positioning of the alignment system 14, marking lens 351, inspection system 20, and possibly an optional mark verification reader. In an embodiment wherein the wafer is translated, alignment and beam scanning may be simplified. In an embodiment where the positioning sub-system or portion of the sub-system is translated fiber beam delivery from a remote laser source to marking head 19 may be used to an advantage.

In one embodiment for wafer marking a Z-axis stage 28 may be used. A range of at least +or −2 mm is preferred. The beam positioner 19 and lens 351 may move, but movement of the wafer is preferred. The Z motion may be determined by the focus of the alignment camera system components 13, 15. The sag and warp of the wafer is preferably compensated by movement (translation, roll, pitch) of the wafer with the positioning system 18, 17 or by movement of the beam positioner 19 as described above.

A total Z range of travel of about 12 mm, implemented with one or more translators, may be used to allow a robotic end effector to load a wafer while allowing for compensation of wafer sag by relative movement of the wafer and marking beam focus location.

A method for controlling contamination may be an advantage. For example, a tilted window, placed between lens 351 and the workpiece, with a slight amount of vibration may remove particles from the marking lens. Air pressure may be used to clean the lens during idle periods. A tilted window will displace the beam and aberrations may be introduced. Certain errors (e.g.: beam displacement) may be corrected during calibration. Alternatively, an "air knife" may be used to produce fast moving air across the lens.

An exemplary exclusion zone of about 2–3 mm is typically used.

The wafer nest may have vacuum applied on the 2 mm exclusion zone. The nest may be held with a kinematic mount.

The focal position of the alignment system lens 15 and camera 13 may be used for determining a Z-axis location and for fine positioning of the beam. In one embodiment the wafer is translated. Alternatively, the camera system may be focused and the position recorded. The position my then be related to the beam positioner coordinates (e.g.: the lens position) and the lens and positioner translated accordingly.

In one embodiment slight relative movement of the Z-axis position may be used to compensate for sag and warp. For instance, a change in the z-axis position may be effected at a plurality of marking locations over a 100 mm marking field. For instance, Z-translation may occur at nine locations (e.g.: to compensate from center to edge).

The X-Y table may have a range of travel of about 12–18 inches, with linear encoders for position feedback.

An inspection module may have optical resolution of about 4 microns.

A telecentric lens may be used with the fine alignment system.

The inspection module 20 may also be used for certain alignment operations (e.g. locating a fiducial on backside) and may be calibrated using a transparent alignment target to establish correspondence with the coordinate system of the fine alignment camera 13.

The recommended marking depth for optimum reading, while avoiding substrate damage, may be about 3.5 microns. The laser system may be configured for a maximum mark depth of about 10 microns.

Embodiments of the present invention may be used to mark wafers with programmable field sizes and number of fields (e.g.: 9–16 fields of view on a wafer having a diameter in a range of 150–300 mm), focusing options (e.g.: 3 focus positions for wafers 775 microns thick with increasing density for thinner wafers), and various marking speeds (e.g.: 150–250 mm/sec).

Various exemplary and non-limiting system parameters and associated tolerances may include:

| PARAMETER | TOLERANCE |
| --- | --- |
| Encoder Resolution | .1 microns |
| Z-stage Travel | 10 mm |
| Z-stage Perpendicularity | .1 mRad |
| Z-atage Accuracy | +/−5 microns |
| Fine Alignment Repeatability | 1–2 microns |
| Spot Size | ≦60 microns nominal, 25–40 µm preferred |
| Galvo (calibrated field) | +/−30–50 micron accuracy |
| Marking Lens Option (due to sag) | telecentric, +/−3 micron, 300 micron wafer thickness, 300 mm wafer |
| Marking Lens Option | flat field, +/−10 micron, 775 micron wafer thickness, 300 mm wafer |

Numerous alternatives may be used to practice the invention. Variations of the positioner type, number of positioners, vision systems, focusing hardware, laser types including q-switched and fiber lasers, may be used. Furthermore, the choice of serial/parallel operation of multiple markers and inspectors for efficient production time management and yield improvement, including cluster tools and statistical process control may be incorporated for use with a precision marking system of the invention. Further, it is contemplated that the pattern recognition and marking techniques of present invention may be used alone or in combination with other production processes, for instance the "dicing" operation described in the aforementioned '943 patent.

Section 1—2D/3D Calibration

Various commercially available marking and workpiece processing systems calibrate the laser marking field by marking a grid on test mirror and measuring the grid on a separate coordinate measuring or metrology machine. It is an iterative process and very time consuming. Other laser systems use the on-line through-scan-lens vision system to calibrate the laser-marking field on the same side. Alternatively, a substrate or disposable workpiece may be marked.

Figure 11A:
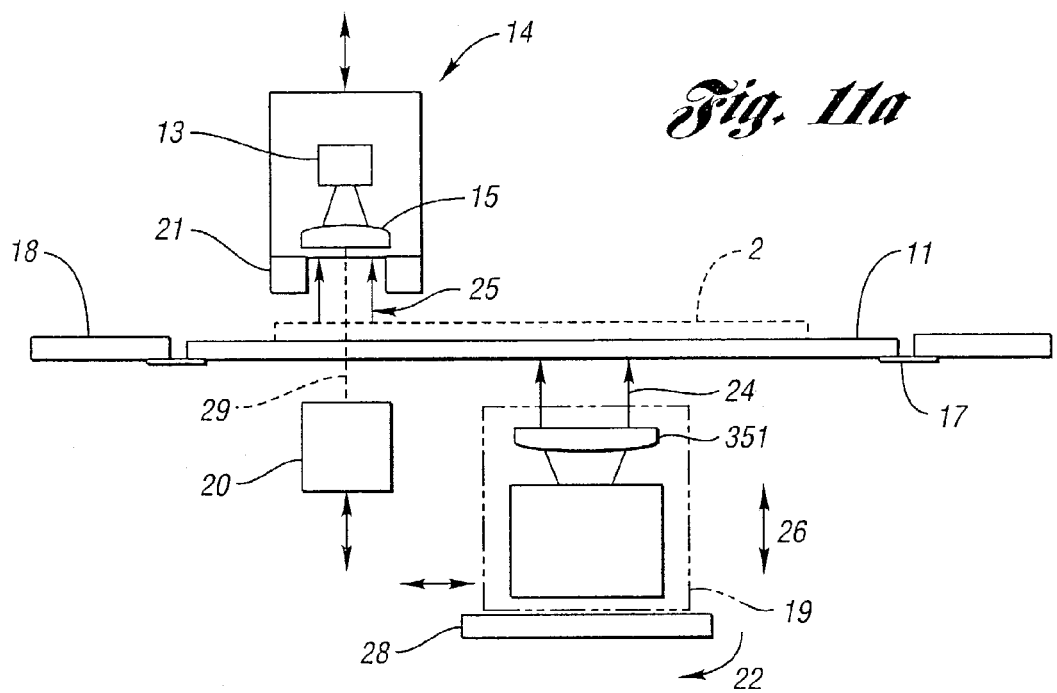
FIGS. 11A–11D relate to two and three-dimensional calibration of the workpiece processing system of FIGS. 2A and 2B with various calibration targets.

In accordance with the present invention, "two-dimensional calibration" utilizes an x-y stage, a pair of stages translating the workpiece and/or marking head, or other arrangement which allows the on-line machine vision sub-system 14 of FIG. 11A to calibrate the laser marking field 24 on the OPPOSITE side. The calibration is used to mark the second side based on vision data and features from the first side.

Calibration may be system dependent and manual, automatic, or semi-automatic. By way of example, four steps for calibration are shown below to illustrate aspects of overall system calibration:
1. Calibrating camera pixels for each camera in system.
2. Calibrating coordinates of a first camera to a second camera.
3. Calibrating stage coordinates to camera coordinates
4. Calibrating the scan head to the wafer nest.

Figure 11B:
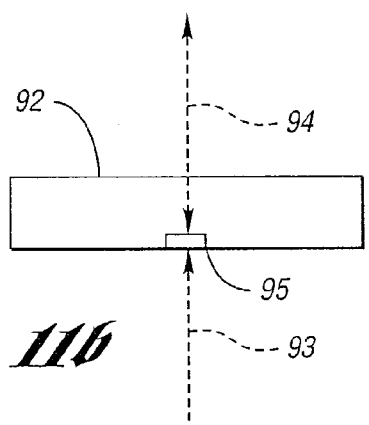
Figure 11C:
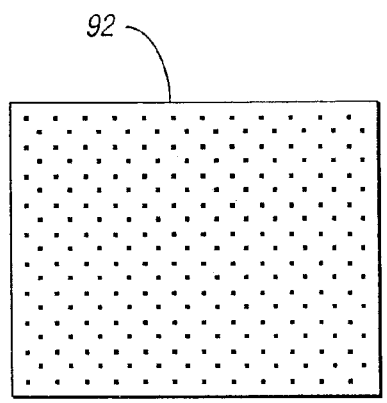
Figure 11D:
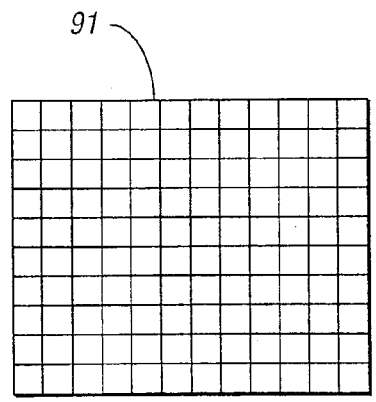
Figure 11E:
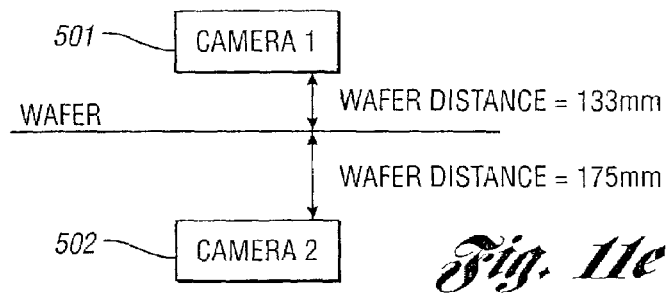
FIGS. 11E–11J further illustrate various calibration target configurations for calibrating various subsystems within a laser marking system.
Figure 11F:
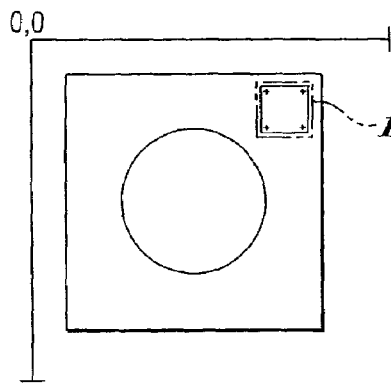
Figure 11G:
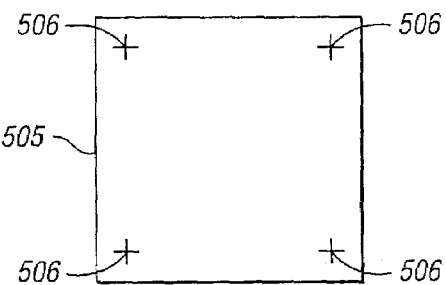

FIG. 11E schematically illustrates a typical arrangement for respective top and bottom cameras 501 and 502. In at least one embodiment of the present invention each camera is calibrated separately to match the camera pixels to actual "real world" coordinates. FIGS. 11F and 11G schematically illustrate a "tool area" 505, which is relatively positioned within camera 501,502 fields of view. Preferably, the cameras may be mechanically positioned within the system so the fields of view substantially overlap, but the fields may be separated. In one exemplary arrangement the crosshairs 506 may be about 5 mm apart. The calibration may include measuring the coordinates of the crosshairs and estimating a center position, scale factors, and rotation of a coordinate system relative to the tool. Preferably, at least the "pixel size" of the camera will be measured. Alternative embodiments may include additional crosshairs of other suitable targets and calibration of sub-fields within the camera field of view.

Figure 11H:
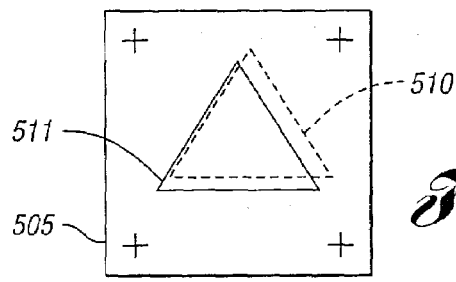

FIG. 11H illustrates a calibration step wherein the top and bottom cameras preferably view (simultaneously) target 511 as seen by a first camera and the same target depicted by dashed lines 510 as seen by a second camera. The calibration target may be within the "tool area" as shown. A correction for offset, scale, and rotation is applied. In one embodiment an additional crosshair may be used to specify the center of the object. This arrangement, with precision calibration, is particularly useful for providing a display showing a mark on the backside of a wafer relative to a die position as seen on the front side for the purpose of mark inspection (see SECTION 6).

Figure 11I:
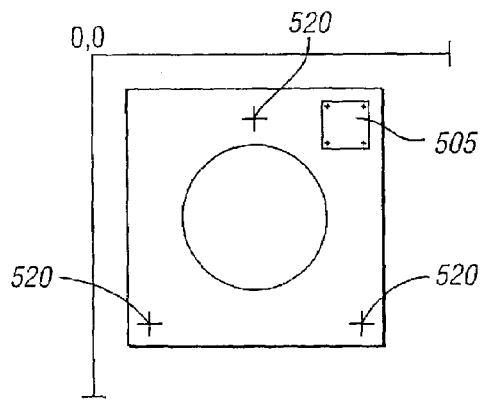

Yet another calibration step may be applied to compensate for X-Y stage tolerances. FIG. 11I illustrates three crosshairs 520 used for calibration wherein the entire nest is moved and camera coordinates are related to stage coordinates. As such, the tolerance stackup of the stage is compensated.

Figure 11J:
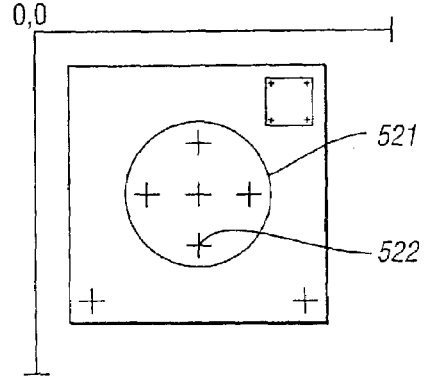

Yet another calibration may be applied to calibrate the scan lens 351 of marking head 19 in FIG. 11A to stage coordinates. FIG. 11J shows a consumable part, for instance a black anodized disk 521 which may be marked with five crosshairs, one shown as 522. Software is used to inspect the marked plate. The marking field may be a fraction of the disk 521 size, and an X-Y stage provides for relative positioning of the disk and marking beam.

These basic steps above may be sufficient and preferred in a system wherein marking performance is substantially invariant with depth (e.g.: large depth of focus, relatively large laser spots, relatively small wafers having exemplary thickness of about 775 microns and minimal sag).

In one embodiment the alignment vision subsystem 14 of FIG. 11A may be calibrated first with a previously marked wafer or alternatively with a precision grid (e.g.: each preferably conforming to a calibration standard). For instance a 200 mm wafer or other maximum wafer size to be marked with the system may be used. The wafer marks may include with a grid of fiducials similar to a crosshair 522 of FIG. 11J. In one embodiment the wafer has a 77×77 array of crosshairs with 2.5 mm spacing with a special pattern at the center of the grid. The camera focus is preferably checked (e.g: contrast measurement) over the grid and mechanical adjustments made to the nest. Alternatively, a positioner (e.g.: see FIGS. 9A–9C) may be adjusted in depth or attitude if used in a system. The marked calibration wafer is also used for a next calibration step wherein the X-Y stage 18 is calibrated. The initial X-Y stage calibration may take several hours to complete with calibration over the range of travel, the calibration information being recorded by imaging a crosshair or other suitable target on the calibration wafer. The data is then evaluated. A third calibration step of the embodiment is a marking field calibration wherein a 200 mm wafer (or maximum size wafer to be marked) is marked with a pattern similar that of FIG. 11J, or other pattern with suitable density. Preferably, the X-Y stage is calibrated as above prior to calibration of the marker. The mark positions are then measured with using the fine alignment camera, or with a separate vision subsystem. For example, the marks may be measured with a commercially available, "off-line" precision Metrology system produced by Optical Gaging Products (OGP), for instance a Voyager measuring machines. If marker field calibration is to be periodically repeated as part operation of the marker in a production environment, the alignment vision system may be used. Preferably, the resolution and accuracy of the alignment system will substantially exceed the minimum mark spacing.

Compensation for workpiece sag and warpage may require maintaining the same spot size with different working distances. Besides, there is an increasing need to change laser beam spot sizes during operation to meet different application parameters, such as line width, character size, mark contrast, hard-mark, soft-mark, throughput, etc. Three-dimensional calibration provides calibration at a plurality of marking positions along the Z-axis. As a result, the laser marking field capability is provided for changing the laser beam working distance and/or spot size automatically while maintaining the laser beam position accuracy.

There is also an increasing need to change the size of the field of view (FOV) of the machine vision system during operation to meet different application requirements. Three-dimensional calibration on machine vision allows the system to change the size of FOV automatically and maintain the vision dimension accuracy at the same time.

Referring to FIGS. 11A–11D, in one arrangement, a two-dimensional calibration procedure relating a position of the first side to the laser marking field 24 on the second side includes a calibrated machine vision sub-system 14 and calibrated x-y stage 18 that will mark a mirror 92 (one mark shown as 95 in FIG. 11B). A description of the calibration of stage 18 and camera sub-system 14 is shown below (steps 1 and 2). The test mirror is positioned at a predetermined working distance with coated surface facing the laser source. The marking laser beam 93 is directed to several locations on the surface so as to mark 95 an N×N grid on the mirror 92. In the illustrated embodiment the x-y stage 18 moves the mirror in both x and y directions so that the alignment vision camera 13 can "see" each node on the grid from non-coated surface of the mirror (opposite side from laser source). Illumination from light source 21, or other suitable illumination, is used and depicted by illumination beam 94. The coordinates of each node are recorded. A calibrated algorithm or look up table is then generated relating the coordinates.

The calibration techniques described herein are not restricted to "topside" imaging and "bottomside" marking. For example, the process may be applied to wafer marking in a system where a chuck holds the wafer in a vertical position, and the marking and illumination beams are substantially horizontal. Likewise, the workpiece may be marked from the topside based on calibration and reference data from the bottom-side. Similarly, the process may be adapted for calibrating separated alignment and marking fields, both covering regions of a single side of a workpiece.

In order to optimize the system for different application parameters, sometimes one or more machine settings might require adjustment during the operation. When the change in setting affects the system accuracy, a new calibration will be required. The three-dimensional calibration process is used to create multiple layers of calibration files with respect to different system settings. A three-dimensional calibrated system can switch between different settings automatically and achieve the required performance and accuracy by using the corresponding calibration files. Exemplary methods to achieve three-dimensional calibration for different settings on the system include:

1. Laser beam spot size versus laser working distance: Use z-stage 28, and/or a combination of relative motion of chuck 17, and/or motion of an optical sub-system within marking head 19 to relatively position the test mirror to different working distances with respect to the laser source. Varying the working distance de-focuses the laser beam and provides different spot size at the work surface. It has been determined that a defocused spot provides acceptable mark quality for certain workpieces, and hence is considered. The two-dimensional calibration described above is repeated for each working distance. As the result, a group of calibrated algorithms or look up tables for different spot sizes with corresponding working distances is generated.

2. Laser beam spot size versus laser beam expander setting: Use an expander for focus control, zoom expansion control, or the combination. For instance, a computer controlled embodiment of the expander 49 shown in FIG. 4 may be used to achieve different laser beam spot sizes on a work surface at fixed working distance. Different combinations of laser beam expansion and focus can be used to achieve a desired spot size. Then the two-dimensional calibration described above is repeated for each beam expander setting. As the result, a group of calibrated algorithms or look up tables for different spot sizes with corresponding beam expander settings is generated.

3. Laser beam working distance versus laser beam expander setting: Use an expander for focus control, zoom expansion control, or the combination. For instance, a computer controlled embodiment of the expander 49 shown in FIG. 4, may be used to achieve same laser beam spot sizes on a work surface at different working distances. The laser beam focus relative to the work surface could be held constant or could vary by using different expansion settings while keeping the same spot size. Then the two-dimensional calibration described above is repeated for each beam expander setting. As the result, a group of calibrated algorithms or look up tables for different working distances with corresponding beam expander settings is generated.

4. Machine vision field of view versus vision lens/camera setting: Adjust the zoom and focus on vision lens/camera 13, 15 of subsystem 14 to achieve different sizes of field of view on a work surface. Repeat and generate a calibration algorithm or look up table for each vision lens/camera setting. As the result, a group of calibrated algorithms or look up tables for different fields of view with corresponding lens/camera settings is generated. On an alternative arrangement, "software zoom" capability provides for a useable range of operation without requiring moving parts. In yet another arrangement the digital and optical techniques may be combined.

In a preferred arrangement capability will be provided for adjustment of system parameters (e.g. laser beam working distance and spot size) while maintaining calibration in the presence of "sag" or workpiece warpage. The warpage may be significant relative to the depth of focus for smaller spot sizes, particularly for thinner wafers or workpieces (e.g. 300 µm thick, 300 mm diameter). In one embodiment the alignment vision system 14 (e.g. positioned relative to the first side) and marker coordinates may be calibrated with at least the following steps:

Step 1.

Camera Calibration:

Use a precisely made grid template 91 (shown in FIG. 11-D) to calibrate the fine alignment camera's pixel size over the field of view 25 to the real world unit. This will compensate for geometric distortion of the lens system and other static errors. In an alternative arrangement a single "point" target may be translated through the camera field providing stage limited accuracy performance over the field 25, at the expense of additional calibration time, but may eliminate a requirement for the grid.

Step 2.

X-Y Table Calibration:

Use the fine alignment camera sub-system and x-y stage 18 to measure a precisely made full field size grid, which approximates or matches the workpiece dimension (e.g. largest workpiece to be processed with the system). This step will compensate for static errors (e.g. tolerance stackup), including non-linearity and non-orthogonality of the stages.

Step 3.

Marker Field Calibration:

Laser mark a full field size 24 grid on a mirror 92, as shown in FIG. 11C. Use the calibrated fine alignment camera (from step 1) and the calibrated x-y table (from step 2) to measure each mark 95 of the grid on the mirror over a marking field 24. This step will compensate for geometric distortion of the laser scanning lens and Galvanometer system and other static errors.

Step 4.

Three Dimensional Marker Field Calibration:

In order to compensate for wafer sagging and warpage, the wafer is marked a plurality of levels along the Z-axis 26.

Multiple marker field calibrations may be required. In this case, relative motion of one or more of the (1) stage 18, (2) marking head 19 or internal optical components, for instance expander components 49 of FIG. 4, (3) stage 28, or (4) chuck 17 provides for relative positioning of the marking beam and grid. The marking occurs at several pre-determined levels along the Z-axis 26. Step 3 is repeated for each level.

Step 5.

Three Dimensional Fine Alignment Camera Calibration:

In order to compensate for different wafer thickness, focusing of the fine alignment camera is set at some slightly different surface levels. The focusing operation may include translation of the fine alignment sub-system 14 along the Z-axis, or by adjustment of lens system 15, or in combination. Similarly, a Z-axis stage may be used to translate the workpiece. Multiple vision field calibrations may be required. In this case, fine alignment camera will focus at several pre-determined surface levels along the Z-axis. Step 1 is then repeated for each surface level.

The technique in Step 4 will also allow setting different spot sizes (by de-focusing) on the fly for different applications Various curve fitting methods known in the art may be applied at each of the calibration steps to improve precision. The technique in Step 5 can also be applied to register the mark inspection camera 20 and fine alignment sub-system. For instance, the optical centerline 29 may be approximately aligned at setup and the calibration procedure used to precisely register the sub-systems. This is desirable so that the inspected marks may be displayed with a mark overlaying the corresponding die (for visual inspection), for instance. Software will be programmed to select correct calibration files for proper application.

Section 2—Feature Detection and Fine Alignment

In the GSI Lumonics WH4100 wafer marker, offered by the assignee of the present invention, a fine alignment vision sub-system corrects rotational or offset errors (X, Y, Angle) which are introduced when a wafer is placed in the marking station. A manual "teach tool" allows the user to train the system to recognize three non-collinear points on the wafer that is to be used for the correction. The operator selects three regions of the wafer (e.g. three corners of the overall pattern 115 of FIG. 12. During 4100 operation a positioner then positions the camera over the wafer and a die corner is visually selected. A "vision model" of the region is generated using an iterative trial and error process with various adjustments. For instance, lighting adjustments are used to enhance contrast so that an acceptable match ("model score") is obtained at each of the measurement locations. Manual evaluation of the results is required with the system. The model information is then used to determine mark locations on the bottom side of the wafer.

The model 4100 is used to process wafers up to 200 mm in diameter using a "full-field" backside laser marker (e.g.: marker field covers the entire wafer). However, future generation marking systems will require marking of, wafers up to 300 mm, for example, with miniature die or packages of finer dimensions (e.g. 0.5 mm). Also, smaller wafers may also be produced in the future with die sizes a fraction of a millimeter.

Figure 12A:
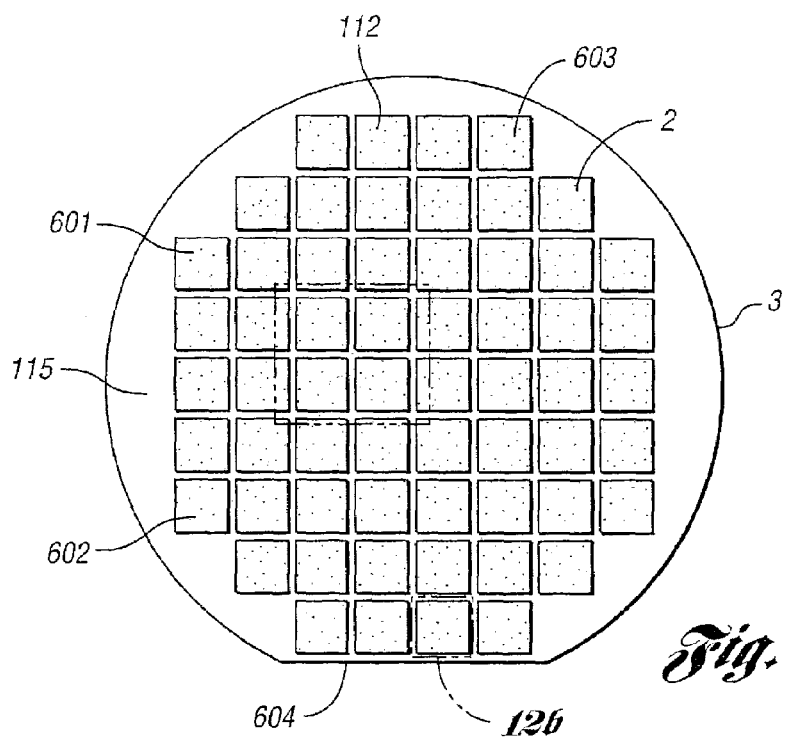
FIGS. 12A–12C illustrate several features that may be located within a field of view on a first side of a wafer, the feature locations being used to determine a position of a marking beam on the opposite side, for example.
Figure 12B:
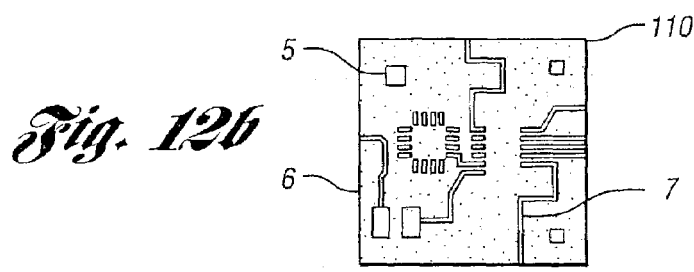

Referring to FIGS. 1A and 12A, in a preferred embodiment of a system of the present invention the die pattern layout 115 and locations for mark registration (e.g. reference data from the first side) are automatically determined by pattern matching of circuit features across the wafer 3 using a vision sub-system. Preferably, no operator intervention is required, or at least the intervention is substantially reduced. In certain applications the number of regions to be analyzed may be increased (beyond three) to improve estimates.

By way of example, FIG. 12A illustrates several features, which may be used in the matching process. Within a die 112 circuit features may include pad 5 which may be an interconnect, but as illustrated may be a local fiducial. Other features to consider include trace edge locations 7, die outline 6, or corner 110 locations. As shown in FIG. 1D similar information may be obtained from a grid array of interconnects, for instance the die edge 6 or location of the Grid Array ball centers 8. The former approach is preferable, if the contrast is high. However, if the contrast is low at the location 6 between the die edge and the surrounding "street," the grid array locations or other features may be selected for training (e.g. if higher in contrast). Similarly, the system may be trained to include the spacing 114 between the die. It is contemplated that the average measured spacing between several die (e.g. average pitch) will be a reliable measure and easy to relate to an available "wafer map." For instance, the average spacing may be measured between every die and the results averaged. The available wafer map provides coordinates of the die within the pattern and associated information for marking. Such information may be obtained by estimating the locations of die edges (e.g. least squares fit) near the corners, or with the use of correlation techniques to match a grey scale or binary image of region 116, which may be defined from the corner locations. Other features which may be present include local fiducial(s) 113 (if present), or identification marks (letters, codes, etc). Such features may be used alone or in combination with the above.

Those skilled in the art of machine vision measurement and pattern recognition will recognize that a number of tools may be used to obtain the information be used for the automatic teaching method. For example, the AcuWin vision software provided by Cognex is suitable for performing various internal "matching" operations. WO0161275, earlier cited herein, also teaches various automatic learning algorithms for use in a 3D system for inspection.

In one embodiment, during the training operation, a wafer is loaded into the system after the pre-aligrnent step. The algorithm then determines at least one of three regions for training based on wafer map information. The region information will often be replicated over the wafer, so a single pattern may apply to the entire wafer. Preferably, the system is calibrated with the 2D/3D calibration process prior to teaching, but a complete calibration may not always be required. Referring to FIG. 2A, the wafer 11 (corresponding to 3 of FIG. 1A) and alignment vision system 14 are relatively positioned to view the region. Feature detection algorithms are executed, ultimately producing coordinate locations for the die (and the backside marks). Preferably, the contrast between the image features is also automatically controlled by lighting or focus adjustments to improve performance. Methods for focus and illumination control are well known in machine vision and non-contact optical metrology. Preferably, the process is repeated in each region to obtain performance statistics for various features that may be ranked and selected accordingly for marking subsequent wafers.

FIG. 12A shows a view of the of the front side, with a notch 604 (or alternatively, a flat as shown in FIG. 12A) at the bottom of a typical wafer. In order to generate this transformation for each wafer at run-time, a minimum of three points that are easy to locate and span a reasonably large portion of the wafer surface area are to be selected. In at least one embodiment of the present invention, a position that can be calculated based on qualitative information is associated with the point (such as die corner—upper-left, upper-right, lower-left, or lower-right—and die row and column number). FIG. 12A shows three exemplary dies 602, 601, 603 which may be used. The expected location of each point is calculated based on the information, and may be used to construct a "theoretical polygon" that is substantially aligned to the movement of an XYZ Stage. At run-time, prior to processing each wafer, pattern-recognition software is used to determine the actual coordinates of these three points on the wafer as it sits in the nest. These points are used to construct an actual polygon that is aligned to the die pattern on the wafer. The polygons are then compared to obtain a transformation (e.g.: translation, rotation and/or scale) between the two coordinate systems. The table below contains basic the information that is to be generated for each point of any given part type before any wafers of that type are processed by the system.

| # | Generated Output Data for Each Point |
|---|---|
| 1 | Row and column number of the associated die at that point. |
| 2 | The die corner used; upper-left, upper-right, lower-left, or lower-right. |
| 3 | A vision model of the area around the taught point. |
| 4 | Coordinates of the point in the "primary" coordinate system. |

The purpose of the FineAlignment training procedure is to generate this information for a particular part type. The table below contains preferred information about a part type that is to be entered into the system before training can begin.

| # | Input Data for Each Part Type |
|---|---|
| 1 | The number of rows and columns of actual dies on the wafer. |
| 2 | The X and Y pitch of the dies on the wafer. |
| 3 | The X and Y die size. |
| 4 | The size of the wafer. |

Referring to FIGS. 12A–12D, preferably, in order to generate the information shown in the output data table for each point, any portion of any die may be positioned at the center of the fine alignment camera's field of view. The location of the die pattern 115 on the wafer and the orientation of the die pattern coordinate system 605 relative to the "primary" coordinate system having origin 607, which is aligned with the movement of the XYZ Stage.

Three pieces of information are sought:

a. The coordinates 610 of a point (x1,y1) in the primary system on the left edge of the die pattern bounding box 606;

b. The coordinates 611 of a point (x2,y2) in the primary system on the top edge of the die pattern bounding box; and c. The rotation of the die pattern coordinate system 605 relative to the primary coordinate system 607.

With this information the location of the upper-left corner 606 of the die pattern bounding box in the primary coordinate system may be determined. The origin of the die pattern coordinate system is then a die_pitch_y up and a die_pitch_x to the left of that as shown. With the position and orientation of the die pattern coordinate system known, the stage may be moved relative to any die location on the wafer.

Upon determining the locations of two actual die corners along the left and top edges of the die pattern, and with capability for positioning any die location in the field of view, a search is performed (e.g.: search up/down and left/right) from these two corners looking for the last die in each direction. The target dies for this algorithm are 602, 601, 603 in FIGS. 12A, 12B and FIG. 1A. Each point is then chosen as one of the four corners of each die. In order to ensure the uniqueness of the area surrounding each corner, the lower-left corner of die 602, the upper-left corner of die 601, and the upper-right corner of die 603 would be selected.

A vision model is to be generated in the area around each corner (including at least a portion of all four neighboring die locations). The model may include various features corresponding to the model of FIG. 12A (e.g.: corners, edges, etc.) The data for all three points is stored for later retrieval by part type, to be used at run-time for processing all wafers of that part type.

Various alternatives may be used to practice a semi-automatic or automatic training algorithm. For instance, additional die may be selected throughout the wafer and least squares fitting done to improve estimates.

Figure 12C:
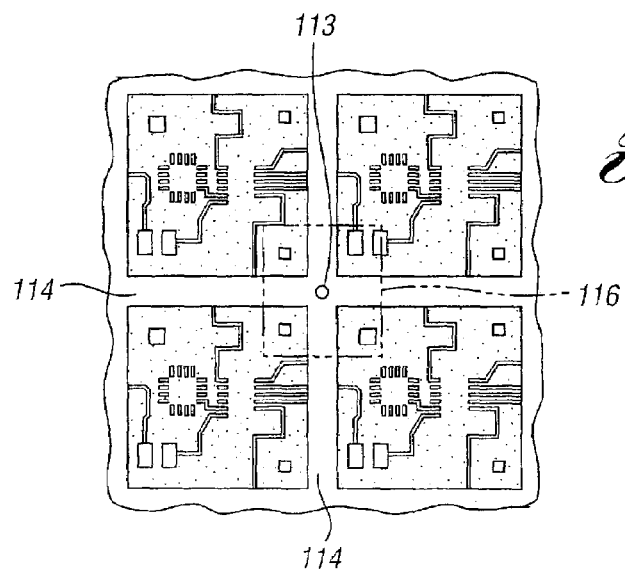
Figure 12B:
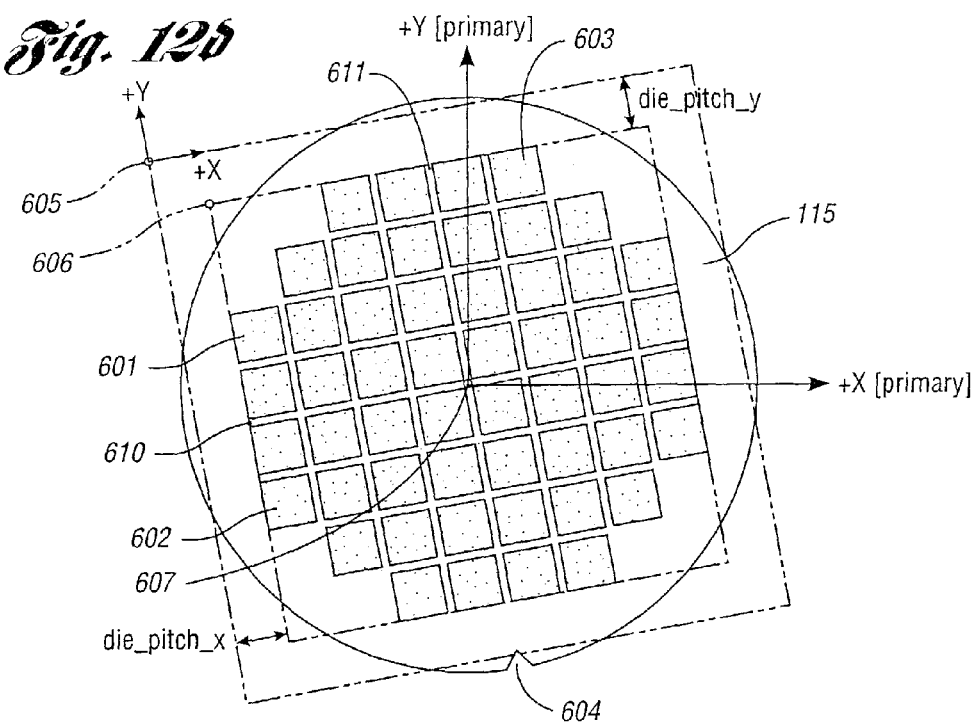

An overall fine alignment process may be semi-automatic, but with an algorithm for automatic measurement of the die pitch with enhanced accuracy. By way of example, the process may begin with a wafer transport tool moving a wafer to the nest. A user interface and display allows an operator to move a wafer stage 18 of FIG. 11A (or alternatively a marking head with the wafer held stationary) to locate a die near the center of the wafer. A pattern, for instance similar to that shown in FIG. 12C, is selected which will be used for the alignment process. An image of a wafer portion is displayed and features identified, for instance the lower corner of a die. A selected region for "teaching" may be evaluated for automatic recognition and the lighting adjusted as indicated for the WH 4100 system previously offered by the assignee of the present invention. Commercially available pattern recognition software may be used, for instance the Cognex AcuWin vision software.

In at least one embodiment the die pitch is measured prior to setting up the at least second and third alignment locations or the at least three locations 601, 602, 603 used to transform coordinates. The operator may position the stage and view the wafer to identify a suitable row of die and further identify die corners, for instance the lower left and upper left corner of a die. The stage may then be moved (e.g.: interactively) to the next die and a corner location identified from which the die pitch in a first direction is estimated. The process is then repeated in the orthogonal direction.

Preferably the estimate is improved using a program to obtain additional data by traversing the wafer along rows and columns, identifying useable die, and locating features (e.g.: corners) of the die with a pattern recognition algorithm. The data may be obtained at each row or column where useful data is available, or in larger increments. The average spacing may be estimated and related to a wafer map.

In a present system of the invention "ease of use" and minimal operator intervention are considered beneficial improvements. Operator inputs may be valuable to verify a column of die are useable, for instance. In one embodiment the operator may verify that a selected die corner is useable and in a "topmost" column.

The additional locations for pattern matching are the selected, the stage positioned, and a test to verify the correct pattern recognition software operation.

Section 3—Workpiece Chuck/Positioner

It is desirable to grip and hold workpieces of varying shapes for the application of second side marking based on first-side data. Similarly, a preferred arrangement can also be adapted for general "double sided" laser processing and/or inspection operations.

Generally, at least one workpiece positioner is provided to relatively position the workpieces, and configured so as to support and position workpieces of varying specified dimensions. The arrangement allows radiation beams to directly irradiate the first and second sides of the workpiece over a large working area. Further, damage to the workpiece is avoided which might result from mounting on a fixture. Still further, a desirable arrangement allows for a robot driven end effector to load a workpiece without movement of chuck.

In at least one embodiment a method and system for edge chucking and focusing populated and blank silicon wafers of variable diameters and thickness is used. The method and system may also be used for other applications, for example in a micromachining process where a radiation beam is to irradiate both sides of the workpiece.

FIGS. 7A–7D illustrates four views of a positioner (top, end, and side views 7A–C, respectively, and perspective view 7D).

Figure 7B:
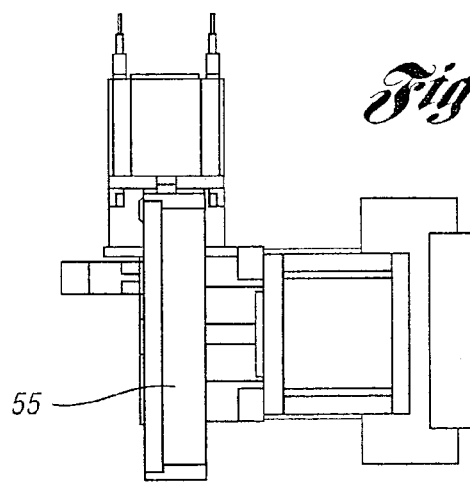
Figure 7C:
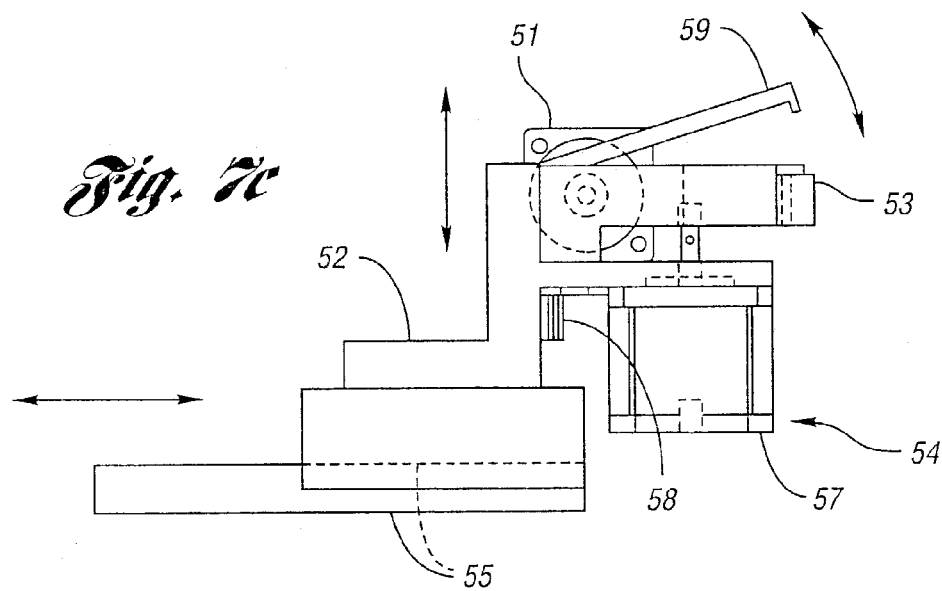
Figure 7D:
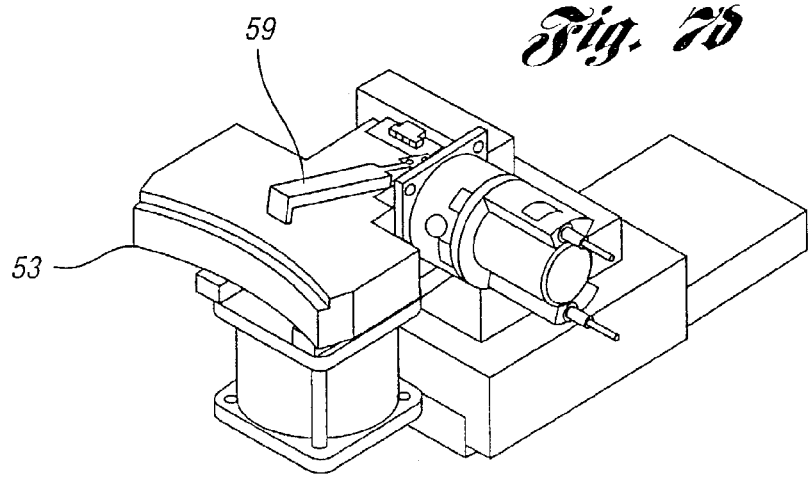
Figure 8A:
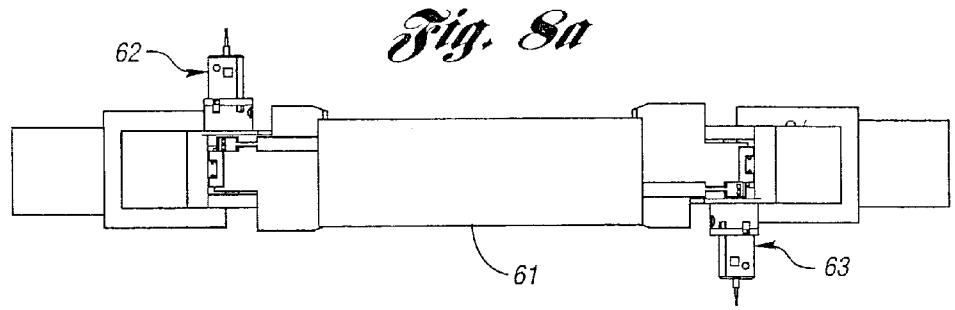
FIGS. 8A–8D are top, end, side, and perspective views, respectively, showing the use of two positioners of FIG. 7 for supporting and positioning a rectangular workpiece (up to and including 2 degrees of freedom)
Figure 8B:
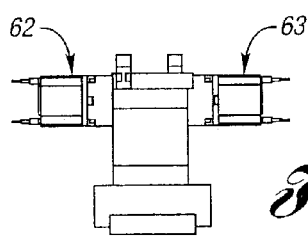
Figure 8C:
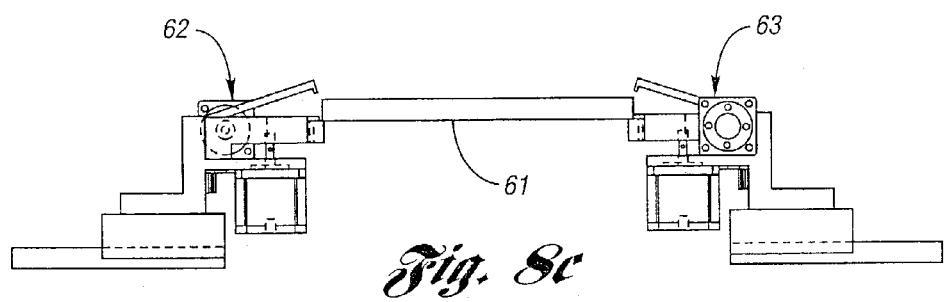
Figure 8D:
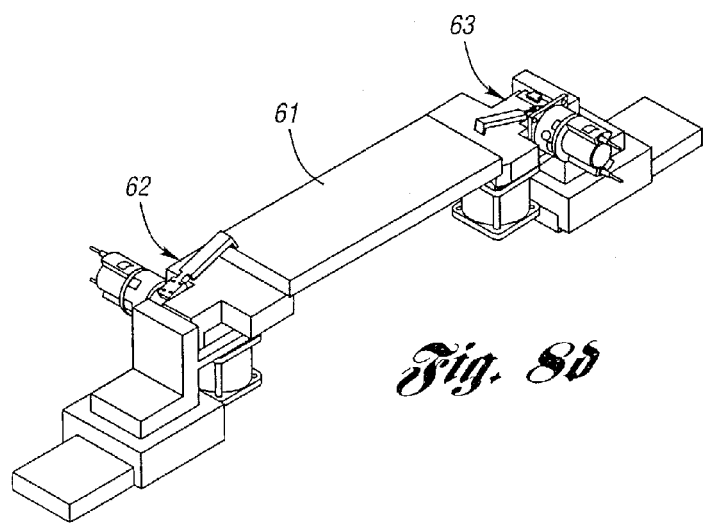

The "chuck" system includes one or more positioners for supporting workpieces of varying sizes, and for fine positioning of the workpiece with one or more degrees of freedom. The chuck system is mechanically coupled to the X-Y translation stage 18 of FIG. 2A or other system components. Referring to the side view of FIG. 7C, a positioner includes a first axis drive 55 (linear stepper motor illustrated), a horizontal linear drive. It is to be understood that the drive may be achieved by various methods: e.g. 1. two position, open loop system such as pneumatic cylinder; 2. multi-positional, closed loop system such as a linear stepper or servo and guide. The pneumatically driven method may be the lowest cost alternative, but provides less positional flexibility. The first axis drive is used to position a second vertical (or normal) linear axis (again achievable through various methods) in the correct location to hold the workpiece. A link 52 between axes provides the coupling. The second, normal or vertical drive 54 is used to position the workpiece at the correct height and orientation (e.g. a plane relative to an X-Y-Z coordinate system) to be in focus to and irradiated by a marking, inspection, or other radiation beams. Attached to this second axis drive 54 (rotary stepper 57 with lead screw and linear guide rail 58 shown) is a holding or "chucking" mechanism 51. By way of example, the workpiece clamping mechanism of FIG. 7C is a pneumatic-rotary actuator 51 with clamp arm 59. Alternatively, the arrangement may be any. combination of vacuum and positive mechanical clamping (such as a pneumatic rotary actuator and a support base). The support base 53 may optionally have vacuum ports, or a base with vacuum and no clamping device, for holding the workpiece while it is positioned and subsequently irradiated or inspected. In FIG. 7C a workpiece support base 53 is shown without vacuum ports. The perspective view in FIG. 7D illustrates the shape of the support base.

The workpiece positioner (e.g. positioning sub-system) may be constructed as shown in FIGS. 8A–8D to hold and adjust rectangular workpiece 61 using two positioners 62, 63 each having the construction described above.

Figure 9A:
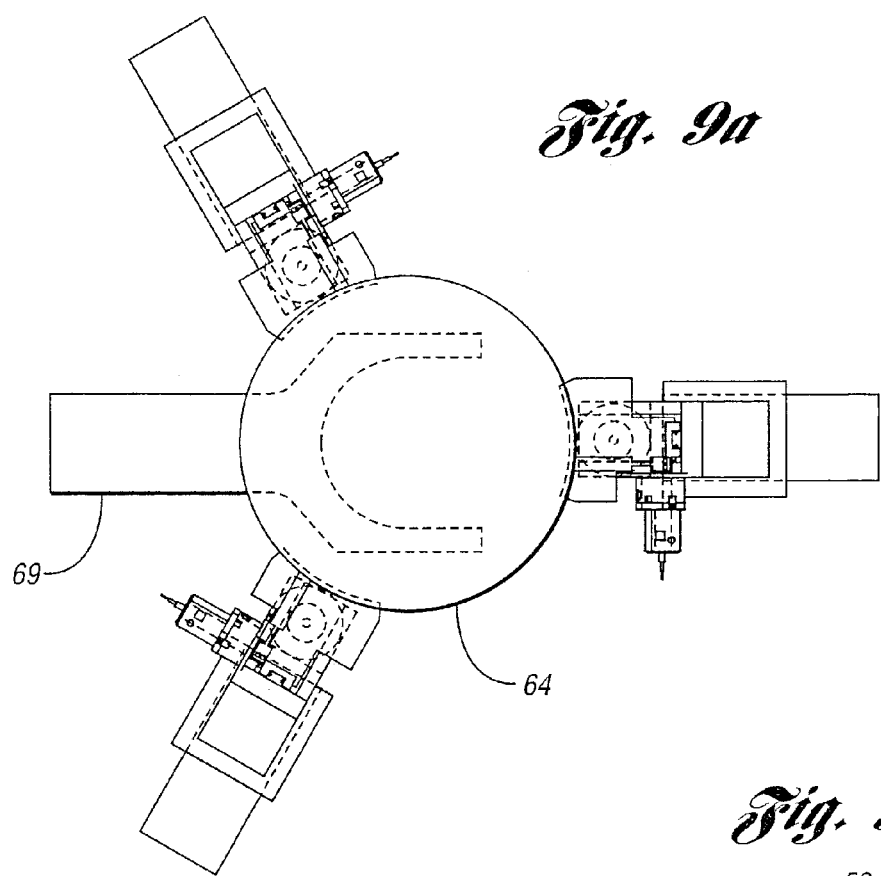
FIGS. 9A–9C are top, side, and perspective views, respectively, showing the use of three positioners for supporting and positioning a round workpiece, for instance a 300 mm wafer (up to and including 3 degrees of freedom)
Figure 9B:
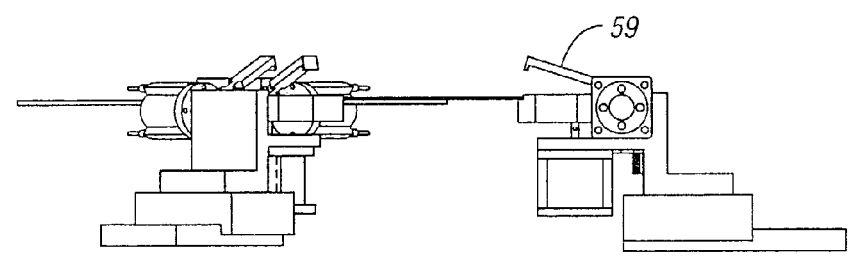
Figure 9C:
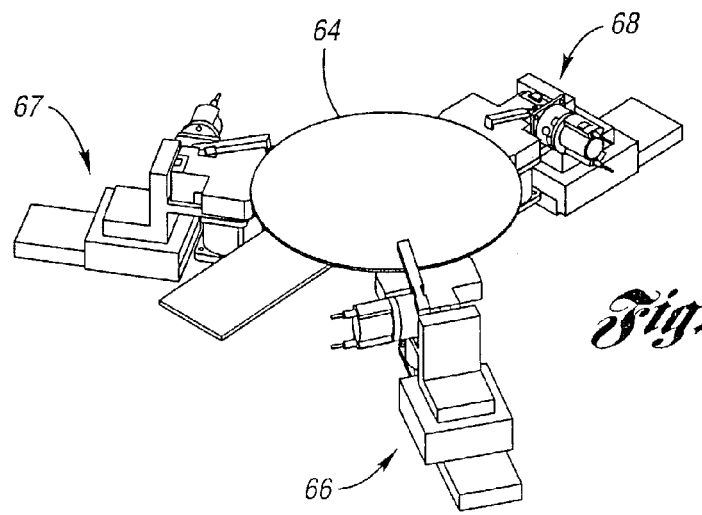

A chuck configuration utilizing, but not limited to, nor requiring, three positioners, driven by closed loop linear steppers or servos, is the preferred method for holding most workpieces. FIGS. 9A–9C illustrate an arrangement with three positioners 66, 67, 68, each which may have the construction above, and an exemplary round workpiece 64, which may be a silicon wafer (e.g. 100, 200, or 300 mm diameter). The wafer is transferred with end effector 69 which is a component of a robot loading tool used in a semiconductor manufacturing process, for example.

In operation, under control of a computer program, the workpiece is loaded by adjusting the distance between support 53 with the first axis drive(s) to match the width of the workpiece. At least the height, and preferably the attitude is controlled with the additional axis. This generally provides, when used in combination with other system components, at least five axes of adjustment (e.g.: X,Y,Z, roll, pitch). Further, the adjustment may be dynamic and occur during the laser processing operation or during idle periods.

Section 4—Laser Parameters and Mark Quality

It is desirable to produce high contrast, machine-readable marks, at high speed in a designated region (e.g. specified by length, width, and depth). Further, conformance to industry specifications prohibits damaging or otherwise adversely affecting the function or operation of the articles (e.g. a semiconductor device).

FIG. 10A illustrates an embodiment which can be applied for various high speed workpiece 77 marking applications. Pulses generated from a Q-switched Vanadate Laser 71, having a typical output wavelength of 1.064 μm, are shifted by wavelength shifter 72 to a shorter wavelength for efficiently coupling the energy into the workpiece. For wafer marking a frequency doubling crystal will produce a wavelength output at about 532 nm. The optical switch 73, typically an acousto-optic modulator, is computer controlled to allow pulses to reach the workpiece 77 on demand. The motion of the workpiece mounted on stage 79 and X-Y galvanometer deflectors 75 is coordinated by the computer. U.S. Pat. Nos. 5,998,759 and 6,300,590, assigned to the assignee of the present invention, teach various aspects related to "pulse on demand" control techniques using a high speed optical switch as applied to semiconductor memory repair. Beam positioning accuracy of about 0.3 μm is typically achieved for cleanly removing semiconductor links.

Preferably the laser output will be generated from an Neodymium Vanadate laser with a wavelength of 1064 nm for processing metal based substrates. The output will be frequency doubled using the second harmonic generator 72 to be 532 nm for non-metal substrates (e.g. silicon or gallium arsenide).

When practicing the present invention various alternatives may be used for pulse energy control, for instance, controlling (pulsing) the pump diode power for "marking on demand" with a series of pulses. U.S. Pat. Nos. 5,854,805, 5,812,569 describe such methods as applied to workpiece processing. A method of pulse control in laser systems is also described in U.S. Pat. No. 6,339,604. Various combinations of pump, q-switch, and optical switch controls may also be of benefit for controlling the energy output, improving reliability, etc.

In a preferred embodiment for marking, a telecentric lens 76 and optical sub-system 74 are used to control the spot size and distribution, which preferably will include optics for varying the spot-size and focus position under computer control.

In an application to laser marking output pulses are produced having a set of pre-determined pulse characteristics including a repetition rate (and corresponding temporal pulse spacing), pulse width, and output energy.

Selected pulses gated by the switch 73 or otherwise controlled (which may be a "burst" or "string" of pulses) irradiate the wafer 77 surface at a first predetermined marking location within the marking field of the mirrors 75. The stage 79 may be a step and repeat stage used when the workpiece is larger than the marking field (e.g. as also illustrated for the "second side" case of FIG. 2A). Referring to FIG. 10B, a laser pulse penetrates the wafer surface (e.g. silicon) within a depth range sufficient to produce a machine readable mark 781 at the marking location. Damage to the wafer is avoided by limiting the depth of penetration 782 (as might be measured by the 1/e energy level) with control of the pulse characteristics, for instance the peak energy and pulse width. Deeper penetration 784 results in a crack. In a preferred system the laser energy at 532 nm will be absorbed at a maximum depth of 10 µm in a typical silicon substrate. This control prevents micro cracking 783 and other hazardous effects inside the substrate (e.g. bubbles). The step of irradiating is repeated at a plurality of marking locations.

Preferably, the pulse width will be within a range of about 10 to 15 nsec to produce a mark with sufficient contrast.

The energy per pulse incident on the surface is preferably in the range of 0.00023 to 0.00025 Joules (eg: 230–250 microjoules) produces high quality marks on Silicon wafers.

Preferably, the marking speed is improved to a higher linear speed on the wafer surface 77, with a relatively high pre-determined pulse frequency of the laser 71. By way of example, a repetition rate of about 15–30 KHz, for instance 25 KHz, provides significant improvement over earlier wafer marking systems used at both near Infrared and Green wavelengths. With a preferred spot size of about 30–35 µm, linear marking speed greater than 150 mm/sec is a relative improvement over previous wafer mark systems. A speed of about of 350 mm/sec is expected for use in a system having the preferred laser pulse characteristics. Reduced solid state laser power at high repetition rates constrained earlier performance, and separation of spots on the surface were observed which limited mark quality.

A laser pulse is focused into a spot diameter to produce energy density within a predetermined range. The minimum distance between a pair of machine readable marks may be further reduced by controlling the spot diameter with optics 74. Such an arrangement may include a "zoom" beam expander in 74 or other optical components which are removable/insertable, preferably under computer control (e.g.: as shown in FIGS. 4 and 6). The spot size adjustment is generally desirable to control the mark linewidth and contrast. A spot diameter in a range of about 30 to 35 µm and a working distance to the workpiece of about 220 mm to 250 mm represent exemplary ranges of operation. The smaller spot size provides improved capability for producing higher mark density compared to earlier marking systems, and higher speed is provided with the pulse characteristics.

Results for backside marking of Silicon wafers have shown the depth range of a mark is to be about 3 to about 4.5 µm so to produce a machine readable mark 781 with enough contrast to the background. The result was contrary to an expectation that larger penetration depth was required. The results also provided additional margin for avoiding damage.

Figure 14:
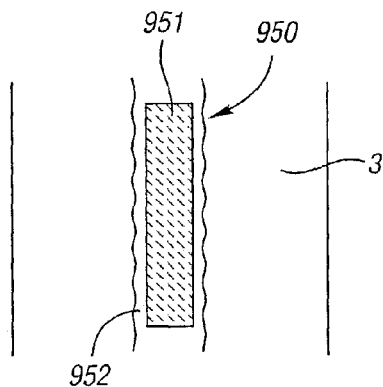
FIG. 14 illustrates schematically features of a laser mark on a semiconductor wafer.

FIG. 14 shows a top view of a mark 950 to illustrate measured variation of average marking depth 951 with various laser parameters. The height in the table below represents material 952 on the side of the mark resulting from removal of material by melting. The average depth variation measured with an interferometer illustrates exemplary performance with laser power and repetition rate at various marking speed. The 100% rating allows for an estimate of maximum performance. The following data was obtained:

| Laser Power (% max. rating) | Rep. Rate (KHz) | Mark Speed (mm/sec) | Average Mark Height (µm) | Average Mark Depth (µm) |
|---|---|---|---|---|
| 80  | 20 | 120 | 4.36 | −4.75 |
| 80  | 20 | 200 | 4.53 | −4.43 |
| 80  | 20 | 300 | 4.65 | −5.61 |
| 100 | 10 | 120 | 3.58 | −5.40 |
| 100 | 10 | 200 | 3.41 | −4.33 |
| 100 | 10 | 300 | 3.64 | −2.90 |
| 100 | 20 | 120 | 4.08 | −9.91 |
| 100 | 20 | 200 | 3.58 | −6.45 |
| 100 | 20 | 300 | 3.55 | −4.53 |

Further analysis of the marks indicated sufficient contrast for machine readability over a range of about 3–4.5 µm. Increasing the mark depth to the larger numbers, for instance 9.91 µm, produced cracking.

An interferometric scan was obtained of a wafer marked at a repetition rate of 10 KHz and a marking speed of about 120 mm/sec. Severe cracking as exemplified by the "spiky" data which results from structural variations at a depth of about 9 µm or more. Scans also showed good results with maximum depth of about 4 µm.

The shifted wavelength may be below the absorption edge of the workpiece material, but need not be restricted to 532 nm. For instance, the workpiece may be Silicon wafers or metal. The wavelength will preferably be substantially less than the absorption edge of Silicon (1.12 µm) for marking in accordance with the present invention.

Suitable lasers may include commercially available diode pumped (DPL) Nd:YAG lasers with about 6 Watts IR output, and output 3 Watts in the Green. An alternative, though more expensive, is a 10 Watt (W) DPL laser with about 10 W IR and 5 W green output power. Preferably, the optical system will contain high efficiency optical components to minimize losses.

The Vanadate laser is preferred for marking Silicon wafers, but is not essential for practicing the invention. The desired pulse characteristics may be implemented with other designs, provided all specifications (e.g. beam quality, stability) are met. For instance, a fiber optic amplified system (e.g. Master Oscillator Power Amplifier) may be used to produce short pulses at relatively high rates. A solid state laser, including a fiber laser, with a slower repetition rate but sufficient power may be "pulse stretched" with a delay line and beam combiner(s) to increase the output repetition rate of the laser system.

Section 5—Precision Telecentric Lens

In precision laser marking and other similar material processing applications, for instance embedded resistor trimming, there is a need to produce fine spot sizes so as to control the width and contrast of a mark (or kerf) while maintaining precise spot placement over a relatively large 3-dimensional field. For instance, a 300 mm wafer may have die sizes ranging from about one millimeter or less with a tightly constrained marking region defined within the die. A spot size of about 30 µm will produce high contrast marks, but the depth of focus is about four-times less than that of earlier marking systems. For thin wafers the warpage may be a significant fraction of the depth of focus, so the three-dimensional spot size/spot placement considerations are valuable.

In non-telecentric scanned laser systems, spot placement errors at a workpiece plane will vary with depth, and may significantly degrade the system accuracy. Such z-axis error may be the result of workpiece tilt, defocus, sag, warp or any deviation from an ideal target plane. For non-normal incident angles of the scanned beam, the z coupling is approximately the deviation angle from normal incidence times the local z error. Preferably, a telecentric scan lens is used for focusing the marking laser onto the field. The telecentric scan lens, well known in the field of laser scanning, is used to maintain a near normal incidence angle of the beam to the workpiece thereby minimizing z coupling and the resulting x and y position errors. The approximate invariance of angle over the field may also have other advantages, such as providing for coaxial detection of reflected radiation. Coaxial detection can be used with many know methods to determine focus position, for example astigmatic spot detection.

Considering the first order scan lens properties, placing the scan origin at the front focal plane of the lens will produce a telecentric scan. In practice, there are non-linearity errors in the lens design that deviate from perfect telecentricity. Those skilled in the art of scan lens design recognize that correction of these errors is possible by modifying the individual lens elements and/or adding additional elements to the lens design.

Typically, an x y galvanometer scan system has two scan mirrors, as shown in FIG. 4. A distance sufficient to prevent physical interference and beam occlusion separates the mirrors. The mirror separation creates different scan origins for each axis and therefore prevents both axes from being located at the lens front focal plane. Often, the focal plane is placed at an intermediate position. This creates an additional field dependent telecentricity error, based on the mirror locations and the lens focal length. In a typical system the error may be 1 to 2.5 degrees at the worst field point. Various techniques are useful for correcting telecentricity error, for instance as described in U.S. Pat. No. 4,685,775 by Goodman, which is hereby incorporated by reference in its entirety. A beam translator improves the correction.

With field dependent error, a portion of the field may be selected to reduce errors at the workpiece. For instance, a small central portion of the field is used and material is processed with improved telecentricity. With one scan mirror located near the front focal plane of the lens, a first axis of the field addressed with this mirror will have better telecentricity than a second axis addressed by a second mirror more remote from the front focal plane. In this case, a portion of the field having improved telecentricity may be selected with a larger dimension along the first axis and a smaller dimension in the second axis, for example a rectangular field. It is also recognized that by using a rectangular field, the first axis may be larger than the edge a square field. Selecting a portion of the field may reduce other field dependent errors such as thermal drift of X-Y galvanometer deflectors. For example, a quadrant of the field where gain drift is mitigated in part by offset drift in each galvanometer may be selected to reduce beam-positioning errors.

For embodiments using through the lens viewing, the scan lens is typically required to image a target at wavelengths other than the processing wavelength. Color correction elements can be used in a design to improve viewing performance. Telecentric scan lenses with color correction for through the lens viewing are know, for instance the scan lens used in the commercially available GSI Lumonics Model W672 laser trimmer.

Figure 13A:
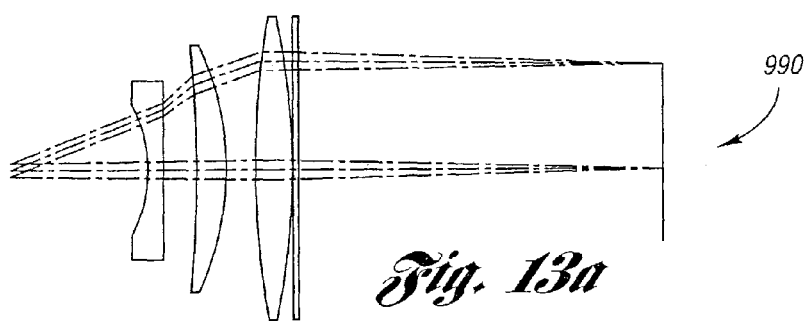
FIGS. 13A–13C illustrate the design of a telecentric lens for use in a precision wafer marking system with a deviation less than about 1 spot diameter over (1) an 80 mm wide field, and (2) a depth range corresponding to nominal wafer sag and warpage specifications.
Figure 13B:
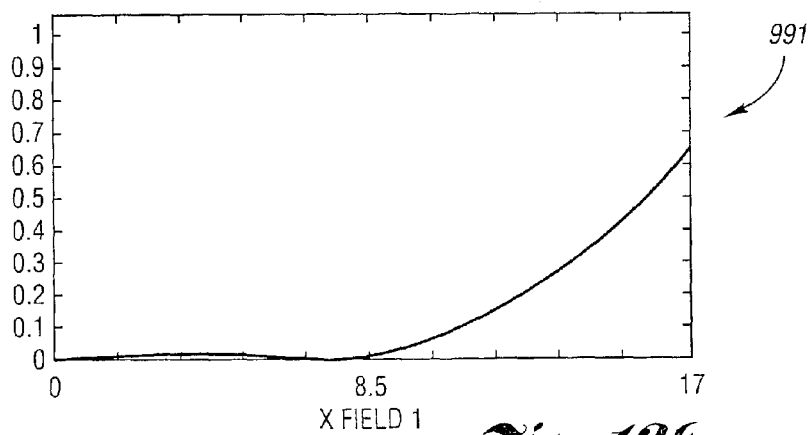
Figure 13C:
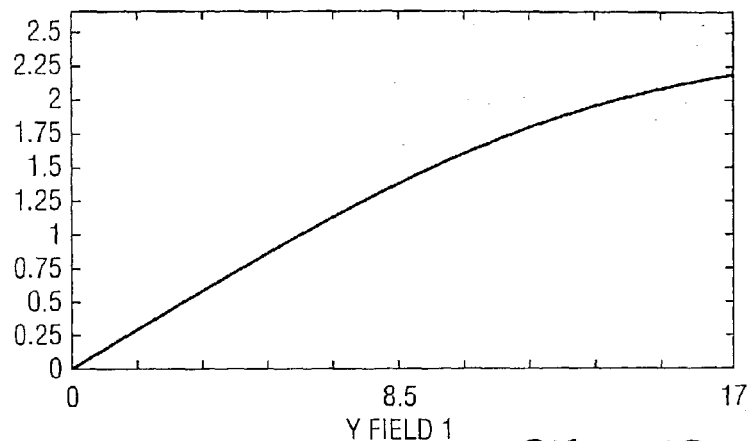

A preferred embodiment for precision laser marking of large wafers and similar applications includes a three-element telecentric scan lens 990 as shown in FIG. 13A. This lens has an effective focal length of 155 mm at 532 nm and is capable of forming 30 micron spots over a scan field of 80 mm square. The total path length is about 360 mm. With uncorrected, spaced mirrors the telecentricity error is approximately 2 degrees. FIGS. 13B and 13C show the telecentricity error 991 and 992 across two orthogonal scan axes. In both cases the error has non-linear variation. Over a depth range corresponding to wafer sag of +−300 µm, the worst case spot placement error is about +−13 µm, slightly less than one spot diameter.

In the precision marking system, wherein three dimensional tolerances determine system performance, the spot placement accuracy of the lens system is to be maintained by including a method for three-dimensional calibration. In one embodiment the wafer is positioned with a workpiece positioner so that a best fit plane (over the wafer) is aligned normal to the marking head. A location is then determined relative to best focus position of the telecentric system of FIG. 13A. The beam positioner is directed based upon the location of features and stored calibration data.

At least one embodiment of the present invention may include a precision scan lens with improved telecentricity when compared with a conventional non-telecentric scan lens. In one example, the maximum angle incident at the workpiece may be less than about half of the maximum angle of the beam incident on the scan lens entrance pupil. In another example, the maximum deviation angle to the workpiece may be limited to less than about 10 degrees. This type of scan lens can be smaller, and may be less complex than a larger telecentric scan lens. Thus, a precision scan lens with improved telecentricity may be used to provide a design compromise with both a level of improved marking accuracy with changes in the workpiece height and reduced lens size, complexity and cost.

Section 6

Backside Mark Visual Inspection with Frontside Die Registration

In early versions of certain backside wafer marking systems an infrared source was used to "backlight" a wafer so as to view backside features. With high density circuitry increasing at a rapid rate, the "backlight" approach will not always be possible in the future.

In one embodiment of a wafer marking system used to form marks on the backside of a wafer, an inspection feature includes a registered display of the mark and die. In a preferred embodiment inspection feature uses two cameras, one above and one below the wafer. FIG. 2A illustrates the camera 13 of fine alignment vision system 14 registered along centerline 29 with the mark inspection system 20. A satisfactory degree of image matching between corresponding front and backside wafer portions may be achieved with manual adjustment at system setup, for instance. System calibration may then be used to improve the precision.

Figure 17A:
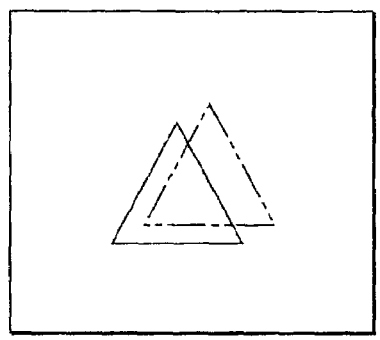
FIGS. 17A–17C show a calibration target and representative superimposed image obtained with separate imaging systems so as to allow for mark inspection and position verification.

In at least one embodiment of the system, the equipment calibrates the bottom camera system 20 to the top camera system. Preferably, the cameras are in fixed positions. One or more cameras may have a zoom lens which is manually adjustable. In one arrangement, a calibration target of a transparent surface is placed between the two cameras. The image is acquired with both cameras. The images are superimposed and, using pattern-matching software, for instance commercially available tools from Cognex Inc, a correction offset, angle, and scale is calculated to align the bottom camera's image to the top camera. FIG. 17A illustrates a calibration target, the image of which is to vary with offset, scale and rotation. Various other commercially available or custom targets may be used. The translation, scale, and rotation correction (including inversion of a coordinate axis) is automatically determined in software.

During the inspection operation the top camera is used to acquire an image of the die on the topside of the wafer. The bottom camera is used to acquire an image of the mark on the backside of the wafer. By superimposing the coordinate systems of the two images, analysis determines the accuracy of the mark with respect to the die.

During inspection, this calibration data is applied to the mark image. Using pattern matching or OCR software the location of the mark relative to the location of the die is known.

It is to be understood that this feature is not restricted to top and backside wafer marking, but may be applied to any two sides or separated fields.

Figure 17B:
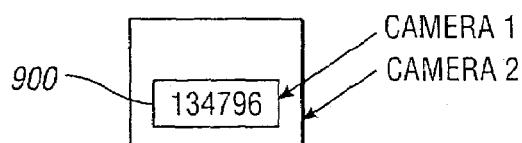
Figure 17C:
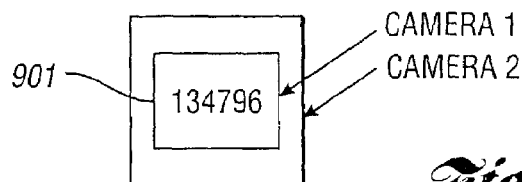

Inspection of marks may be done on-line or off-line. The inspection may include a random sample of die or up to 100% inspection. In at least one embodiment an operator may setup a region of interest 900 within a backside image corresponding to at least a portion of a die as shown in FIG. 17B. Preferably, the operator will be able to adjust 901 the area of interest, as shown in FIG. 17C, and make any necessary adjustments from a wafer map or with minor adjustments between die. A typical mark may occupy 50–60% of the area of a die, but up to about 80% is possible.

While the best mode for carrying out the invention has been described in detail, those familiar with the art to which this invention relates will recognize various alternative designs and embodiments for practicing the invention as defined by the following claims.

What is claimed is:

1. A method of laser marking a semiconductor wafer during at least one step of a semiconductor manufacturing process, the wafer having a first side with circuit features, and a second side having a rough wafer surface portion to be marked, the method comprising:

generating a q-switched laser output for wafer marking, the output comprising an output wavelength less than an absorption edge of the semiconductor wafer material, a laser output power of at least about 3W at the wavelength, a plurality of pulses, each pulse having a pulse width less than about 50 ns, at least one pulse having a pulse width in the range of about 10–15 ns, the temporal spacing between at least some consecutive pulses of the plurality of pulses corresponding to a repetition rate of at least 15 Khz; and irradiating the semiconductor wafer with the output over at least one spot having a diameter in the range of less than about 60 microns to produce a shallow mark having sufficient contrast for machine readability, whereby the at least one pulse irradiates at least about $10^8$ W/cm$^2$ over the diameter while avoiding undesirable subsurface damage to the semiconductor wafer.

2. The method of claim 1 wherein the diameter is in the range of about 25–40 microns.

3. The method of claim 1 wherein the energy of the at least one pulse is in the range of about 230–250 microjoules, whereby the at least one pulse irradiates at least $10^9$ W/cm$^2$ over the at least one spot diameter.

4. The method of claim 1 wherein the laser output power is at least about 5 W at the wavelength.

5. The method of claim 1 wherein the output wavelength is a green wavelength.

6. The method of claim 1 wherein the semiconductor wafer comprises a silicon wafer and wherein the step of generating is carried out using a frequency doubled Nd:YVO$_4$ laser having a green output wavelength.

7. The method of claim 1 wherein the at least one spot diameter is adjustable.

\* \* \* \* \*